(12) United States Patent
Ishida

(10) Patent No.: US 9,313,877 B2
(45) Date of Patent: Apr. 12, 2016

(54) ELECTRONIC DEVICE AND NOISE SUPPRESSION METHOD

(75) Inventor: Hisashi Ishida, Tokyo (JP)

(73) Assignee: NEC Corporation, Tokyo (JP)

(*) Notice: Subject to any disclaimer, the term of this patent is extended or adjusted under 35 U.S.C. 154(b) by 244 days.

(21) Appl. No.: 13/508,974

(22) PCT Filed: Oct. 20, 2010

(86) PCT No.: PCT/JP2010/006218
§ 371 (c)(1),
(2), (4) Date: May 9, 2012

(87) PCT Pub. No.: WO2011/058702
PCT Pub. Date: May 19, 2011

(65) Prior Publication Data
US 2012/0222891 A1  Sep. 6, 2012

(30) Foreign Application Priority Data

Nov. 10, 2009 (JP) .................. 2009-257059
Mar. 12, 2010 (JP) .................. 2010-055539
Sep. 16, 2010 (JP) .................. 2010-207829

(51) Int. Cl.
*H05K 1/11* (2006.01)
*H05K 1/02* (2006.01)
*H05K 1/14* (2006.01)

(52) U.S. Cl.
CPC ............ *H05K 1/0236* (2013.01); *H05K 1/0233* (2013.01); *H05K 1/141* (2013.01); *H05K 2201/09727* (2013.01); *H05K 2201/10265* (2013.01); *H05K 2201/10704* (2013.01); *H05K 2201/10734* (2013.01); *Y10T 29/49155* (2015.01)

(58) Field of Classification Search
USPC .................. 174/261, 250, 254, 255, 262; 361/679.01, 679.02
See application file for complete search history.

(56) References Cited

U.S. PATENT DOCUMENTS

2006/0232949 A1  10/2006  Osaka
2008/0314630 A1  12/2008  Kim et al.
2009/0038840 A1  2/2009  Kim et al.
(Continued)

FOREIGN PATENT DOCUMENTS

JP  2005-005092 A  1/2005
JP  2005-150161 A  6/2005
(Continued)

OTHER PUBLICATIONS

International Search Report in PCT/JP2010/006218 dated Dec. 21, 2010 (English Translation Thereof).
(Continued)

*Primary Examiner* — Tremesha S Willis
(74) *Attorney, Agent, or Firm* — McGinn IP Law Group, PLLC

(57) ABSTRACT

A first interconnect substrate includes a first conductor pattern. A second interconnect substrate includes a second conductor pattern. At least a portion of the second conductor pattern is formed in a region opposite the first conductor pattern. At least either the first conductor pattern or the second conductor pattern has a repeated structure. The first conductor pattern and the second conductor pattern constitute at least a portion of an electromagnetic band gap (EBG) structure.

21 Claims, 29 Drawing Sheets

(56) References Cited

U.S. PATENT DOCUMENTS

| | | |
|---|---|---|
| 2009/0039984 A1 | 2/2009 | Kim et al. |
| 2009/0168367 A1* | 7/2009 | Fujii ............................ 361/720 |
| 2009/0184782 A1 | 7/2009 | Koo et al. |
| 2009/0322450 A1* | 12/2009 | Kim et al. ..................... 333/204 |

FOREIGN PATENT DOCUMENTS

| | | |
|---|---|---|
| JP | 2006-302986 A | 11/2006 |
| JP | 2008-098294 A | 4/2008 |
| JP | 2008-270363 A | 11/2008 |
| JP | 2009-004791 A | 1/2009 |
| JP | 2009-044151 A | 2/2009 |
| JP | 2009-177130 A | 8/2009 |

OTHER PUBLICATIONS

Shahrooz Shahparnia et al, "Electromagnetic Interference (EMI) Reduction From Printed Circuit Boards (PCB) Using Electromagnetic Bandgap Structures", IEEE Transactions on Electromagnetic Compatibility, vol. 46, No. 4, Nov. 2004.

Shawn D. Rogers, "Electromagnetic-Bandgap Layers for Broad-Band Suppression of TEM Modes in Power Planes", IEEE Transactions on Microwave Theory and Techniques, vol. 53, No. 8, Aug. 2005.

\* cited by examiner

ELECTRONIC DEVICE AND NOISE SUPPRESSION METHOD

TECHNICAL FIELD

The present invention relates to an electronic device including two interconnect substrates overlapping each other, and a noise suppression method.

BACKGROUND ART

Many electronic devices represented by computers or the like are formed by a plurality of interconnect substrates. For example, to mount semiconductor devices such as a large scale integration (LSI) onto a motherboard and the like, these semiconductor devices are generally mounted onto, in advance, a package interconnect substrate that functions as a dedicated interconnect substrate. As high-frequency semiconductor devices have been developed recently, it has been found in some cases that electromagnetic noise generated from a high-frequency circuit electromagnetically interferes with other electronic circuits inside the electronic device, and thus obstructs operations of the electronic device.

On the other hand, an electromagnetic band gap (EBG), which is one type of meta-material, has been under development in recent years. The EBG takes a structure in which dielectrics, metals or the like are periodically disposed two-dimensionally or three-dimensionally, and form a band gap for suppressing the propagation of electromagnetic waves having a specific frequency band in the interior or on the planar surface of the structure.

For example, Patent Document 1 discloses a technique for suppressing the generation of interference between connectors of a motherboard by providing an EBG pattern in the interior of the motherboard including a multilayer interconnect structure.

Patent Document 2 discloses a technique for providing an EBG structure in a region located below a semiconductor device in an interposer.

RELATED DOCUMENT

Patent Document

[Patent Document 1] Japanese Laid-open Patent Publication No. 2006-302986
[Patent Document 2] Japanese Laid-open Patent Publication No. 2008-270363

Non-Patent Document

[Non-patent Document 1] Shahrooz Shahparnia et al, IEEE TRANSACTIONS ON ELECTROMAGNETIC COMPATIBILITY, VOL. 46, No. 4, NOVEMBER 2004
[Non-patent Document 2] Shawn D. Rogers, IEEE TRANSACTIONS ON MICROWAVE THEORY AND TECHNIQUES, VOL. 53, No. 8, AUGUST 2005

DISCLOSURE OF THE INVENTION

The connection between two interconnect substrates, such as a motherboard and a package interconnect substrate overlapping each other are often performed by a connection terminal provided between these two interconnect substrates. In such a case, noise may be generated from the connection terminal by a signal transmitting through the connection terminal. Nevertheless, the EBGs disclosed in the above-mentioned Patent Documents are formed inside the interconnect substrate. For this reason, these EBGs do not block noise, such as noise generated from the connection terminal, from propagating through the space between two interconnect substrates overlapping each other.

An object of the invention is to provide an electronic device and a noise suppression method capable of blocking noise propagating through the space between two interconnect substrates overlapping each other.

According to the invention, there is provided an electronic device comprising:

a first interconnect substrate; and
a second interconnect substrate connected to the first interconnect substrate,
wherein the first interconnect substrate includes a first conductor,
the second interconnect substrate includes a second conductor of which at least a portion is formed in a region opposite the first conductor,
the second conductor forms a repeated structure of conductors, and
the second conductor is electrically isolated from other conductors included in the second interconnect substrate.

According to the invention, there is provided a noise suppression method comprising:

providing a first conductor in a first interconnect substrate over which electrical parts are to be mounted;
providing a second conductor in at least a portion of a region in a second interconnect substrate, the region being opposite the first conductor, wherein the first interconnect substrate and the electrical parts are to be mounted over the second interconnect substrate; and
forming a repeated structure in at least either the first conductor or the second conductor, and forming at least a portion of an electromagnetic band gap (EBG) structure by the first conductor and the second conductor, the method being preventing a noise form propagating through a space between the first interconnect substrate and the second interconnect substrate.

According to the invention, it is possible to block noise propagating through the space between two interconnect substrates overlapping each other.

BRIEF DESCRIPTION OF THE DRAWINGS

The above-mentioned objects, other objects, features and advantages will be made clearer from the preferred embodiments described below, and the following accompanying drawings.

FIG. 6(b) is a perspective view illustrating a configuration of an auxiliary connecting member used for the electronic device of FIG. 6(a), and FIG. 6(c) is a perspective view illustrating a modified example of the auxiliary connecting member.

FIG. 7(a) is a cross-sectional view illustrating a configuration of an electronic device according to a seventh embodiment, FIG. 7(b) is a diagram illustrating a configuration of a connection portion of a socket used for the electronic device FIG. 7(a), and FIGS. 7(c) and 7(d) are diagrams illustrating modified examples of the connection portion.

FIG. 8(a) is a cross-sectional view illustrating a configuration of an electronic device according to an eighth embodiment, FIG. 8(b) is a diagram illustrating a configuration of a connection portion of a socket used for the electronic device FIG. 8(a), and FIGS. 8(c) to 8(g) are diagrams illustrating modified examples of the connection portion.

DESCRIPTION OF EMBODIMENTS

Figure 1:
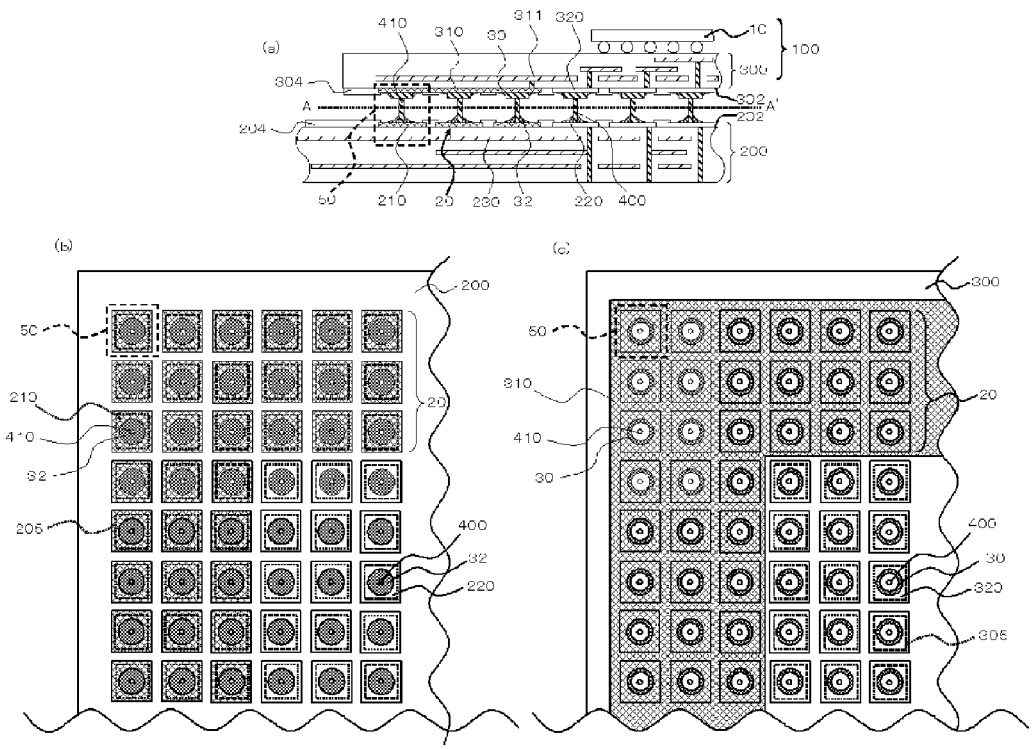
FIG. 1($a$) is a cross-sectional view illustrating a configuration of an electronic device according to a first embodiment, FIG. 1($b$) is a diagram seen downward from the A-A' cross-section of FIG. 1($a$), and FIG. 1($c$) is a diagram seen upward from the A-A' cross-section of FIG. 1($a$).

Hereinafter, the embodiments of the invention will be described with reference to the accompanying drawings. In all the drawings, like elements are referenced by like reference numerals and signs and descriptions thereof will not be repeated.

FIG. 1(a) is a cross-sectional view illustrating a configuration of an electronic device according to a first embodiment. FIG. 1(b) is a diagram seen downward from the A-A' cross-section of FIG. 1(a), and illustrates a configuration of the surface of a motherboard 200. FIG. 1(c) is a diagram seen upward from the A-A' cross-section of FIG. 1(a), and illustrates a configuration of the surface of a package interconnect substrate 300.

This electronic device includes a package 100 and the motherboard 200. The package 100 includes the package interconnect substrate 300 and a semiconductor chip 10. The semiconductor chip 10 is an example of an electronic part, and is mounted onto the package interconnect substrate 300. In an example shown in the drawings, the semiconductor chip 10 is mounted in a flip-chip manner onto the package interconnect substrate 300, but may be mounted by another mounting form. The package 100 is mounted onto the motherboard 200. The package interconnect substrate 300 is an example of a first interconnect substrate, and the motherboard 200 is an example of a second interconnect substrate.

The package interconnect substrate 300 includes a first conductor pattern 310 serving as a first conductor, and the motherboard 200 includes a second conductor pattern 210 serving as a second conductor. The second conductor pattern 210 is formed in a region opposite at least a portion of the first conductor pattern 310, that is, a region of which at least a portion overlaps the first conductor pattern 310 in a plan view. A repeated structure of conductors is formed by at least either the first conductor pattern 310 or the second conductor pattern 210. In the embodiment, at least either the first conductor pattern 310 or the second conductor pattern 210 has a repeated structure, for example, a periodic structure in regions facing each other. The first conductor pattern 310 and the second conductor pattern 210 constitute at least a port n of an electro agnetic band gap (EBG) structure 20. The second conductor pattern 210 is electrically isolated from other conductors included in the motherboard 200. In the embodiment, the second conductor pattern 210 is not directly connected to other conductors included in the motherboard 200.

In the example shown in the drawings, the first conductor pattern 310 is a sheet-like conductor pattern, and the second conductor pattern 210 is a plurality of insular conductor patterns separated from each other. Each of the insular conductor patterns of the second conductor patterns 210 is connected to the first conductor pattern 310 through an auxiliary connecting member 410. The auxiliary connecting member 410 is a pin having a header on its one end. This header is formed in, for example, a circular or rectangular conductor pattern, and is connected to the first conductor pattern 310 of the package interconnect substrate 300 through a solder 30. Meanwhile, the other end of the auxiliary connecting member 410 is connected to the center of the second conductor pattern 210 through a solder 32. A plurality of second conductor patterns 210 are electrically conducted to each other through the auxiliary connecting member 410 and the first conductor pattern 310.

The motherboard 200 includes a conductor pattern 230 in an interconnect layer next to and below the second conductor pattern 210. The conductor pattern 230 is either a ground plane or a power plane, for example, a ground plane, and extends to a region in which the second conductor pattern 210 is formed in a plan view.

In the example shown in the drawings, the package interconnect substrate 300 includes an external connection terminal 320, and the motherboard 200 includes an external connection terminal 220. The external connection terminal 320 is, for example, an electrode pad, and is formed on a surface 302 opposite the motherboard 200 in the package interconnect substrate 300. The external connection terminal 220 is, for example, an electrode pad, and is formed in a surface 202 opposite the package interconnect substrate 300 in the motherboard 200. The external connection terminals 220 and 320 are connected to each other through a connecting member 400. The EBG structure 20 is formed to surround the external connection terminals 220 and 320 and the connecting member 400 in a plan view.

A plurality of second conductor patterns 210 and external connection terminals 220 are formed. The first conductor pattern 310 is formed on the surface 302, and is formed using a conductor layer flush with the external connection terminal 320. The second conductor pattern 210 is formed on the surface 202, and is formed in a conductor layer flush with the external connection terminal 220.

The second conductor pattern 210 and the external connection terminal 220 are disposed so as to form the same lattice. That is, the disposition period of the second conductor pattern 210 and the disposition period of the external connection terminal 220 are the same as each other, and the gap between the second conductor pattern 210 closest to the external connection terminal 220 and the external connection terminal 220 is equal to the mutual gap between the external connection terminals 220. The second conductor pattern 210 has the same planar shape as that of the external connection terminal 220, and is for example, square.

The connecting member 400 is a pin similar to the auxiliary connecting member 410. The header portion on its one end side is connected to the external connection terminal 320 of the package interconnect substrate 300 through the solder 30, and the other end is connected to the center of the external connection terminal 220 through the solder 32. The shape of the connecting member 400 and the shape of the auxiliary connecting member 410 are equal to each other.

The external connection terminal 320 of the package interconnect substrate 300 is connected to the semiconductor chip 10 through an internal interconnect and a via of the package interconnect substrate 300. For this reason, the semiconductor chip 10 is connected to the external connection terminal 220 of the motherboard 200 through the internal interconnect, the via and the external connection terminal 320 of the package interconnect substrate 300, and the connecting member 400. In the semiconductor chip 10, each of the power line, the ground line, and the signal line is connected to the motherboard 200.

Each of the package interconnect substrate 300 and the motherboard 200 is a multilayer interconnect substrate, and is formed by alternate laminated layers composed of a dielectric layer and a conductor layer. The first sheet-like conductor pattern 310 formed in the package interconnect substrate 300 is connected to either the power plane or the ground plane that is the opposite of the above-mentioned conductor pattern 230 of the motherboard 200, for example, that is, the power plane, through a multilayer interconnect (including a conductor pattern 311 one layer below the first conductor pattern 310), a via and the external connection terminal 320 of the package interconnect substrate 300, the connecting member 400, and the external connection terminal 220. Nevertheless, the first conductor pattern 310 may be connected to a plane of the same type as the plane, selected from the power plane or the ground plane of the motherboard 200, to which the above-mentioned conductor pattern 230 is connected. The second conductor pattern 210 formed in the motherboard 200 is not connected to any conductor but the connecting member 400.

Meanwhile, a resist layer 304 is formed on the surface 302 of the package interconnect substrate 300, and a resist layer 204 is formed on the surface 202 of the motherboard 200. The resist layer 304 has an opening 305 for exposing the external connection terminal 320 and the first conductor pattern 310. The resist layer 204 has an opening 205 for exposing the external connection terminal 220 and the second conductor pattern 210.

In the EBG structure 20, each capacitance is controlled by the gap between the package interconnect substrate 300 and the motherboard 200, the size of the second insular conductor pattern 210, the array, the material of the motherboard 200, and the gap between the second conductor pattern 210 and the conductor pattern 230. The inductance component is controlled by the material, the length, and the thickness of the auxiliary connecting member 410. The gap between the package interconnect substrate 300 and the motherboard 200 can be controlled by the shapes of the connecting member 400 and the auxiliary connecting member 410. The band gap zone of the EBG structure 20 can be adjusted by adjusting these shapes.

Next, the operations and effects of the embodiment will be described. In the embodiment, the EBG structure 20 is a so-called mushroom-type EBG, and its unit cell 50 is constituted by the second insular conductor pattern 210, the auxiliary connecting member 410, the first sheet-like conductor pattern 310, and the region in the conductor pattern 230 opposite the second insular conductor pattern 210. Specifically, the conductor pattern 230 is equivalent to a conductor plane on the upper side, and the first conductor pattern 310 is equivalent to a conductor plane on the lower side. The auxiliary connecting member 410 is equivalent to a mushroom-shaped inductance portion, and the second conductor pattern 210 is equivalent to a mushroom-shaped head portion. The EBG structure 20 is formed by the repeated, for example, periodical arrangement of the unit cell 50.

In such a configuration, a capacitor is formed between the second conductor pattern 210 and the conductor pattern 230, and noise is prevented from propagating between the conductor pattern 230 and the first conductor pattern 310. The second conductor pattern 210 is formed in the motherboard 200, and the first conductor pattern 310 is formed in the package interconnect substrate 300. Thus, the EBG structure 20 is formed in the space between the motherboard 200 and the package interconnect substrate 300. As a result, noise is prevented from propagating though this space and being emitted to the outside.

A generation source of the noise includes, for example, the connecting member 400. When the EBG structure 20 is designed so that the frequency of noise emitted from the connecting member 400 is contained in the band gap of the EBG structure 20, noise emitted from the connecting member 400 is prevented from leaking from the space between the package 100 and the motherboard 200.

In the embodiment, the first conductor pattern 310 is formed on the surface 302 of the package interconnect substrate 300 opposite the motherboard 200. For this reason, it is possible to increase the capacitance component of the EBG structure 20 by decreasing the distance between the first conductor pattern 310 and the second conductor pattern 210. Particularly, in the embodiment, since the second conductor pattern 210 is also formed on the surface 202 of the motherboard 200 opposite the package interconnect substrate 300, it is possible to further increase the capacitance component of the EBG structure 20 by further decreasing the distance between the first conductor pattern 310 and the second conductor pattern 210.

Meanwhile, in the embodiment, resin may be injected between the package interconnect substrate 300 and the motherboard 200. In this case, it is possible to adjust the capacitance of the EBG structure 20 by adjusting the material of the resin.

When the "repeated" unit cell 50 is disposed, in the unit cells 50 located next to each other, it is preferable that the gap (center-to-center distance) between the same vias or connecting members is within ½ of wavelength λ of electromagnetic waves serving as assumed noise. The meaning of "repeated" also includes a case where a portion of the configuration misses in any of the unit cells 50. When the unit cells 50 have a two-dimensional array, "repeated" also includes a case where the unit cells 50 partially miss. The meaning of "periodic" also includes a case where a portion of the components is out of alignment in some unit cells 50, or a case where the arrangement of some unit cells 50 themselves is out of alignment. That is, even when periodicity in a strict sense collapses, the meta-material characteristics can be obtained as long as the unit cell 50 is repeatedly disposed, and thus some degree of defect is allowed in the "periodicity". Meanwhile, assumed factors for which these defects are generated include a case of passing the interconnects, the vias, or the connecting members between the unit cells, a case where the unit cell cannot be disposed by the existing vias, patterns, or connecting members when a meta-material structure is added to the existing interconnect layout or intersubstrate connection structure, manufacturing errors, a case where the existing vias, patterns, or connecting members are used as a portion of the unit cell, and the like.

Figure 2:
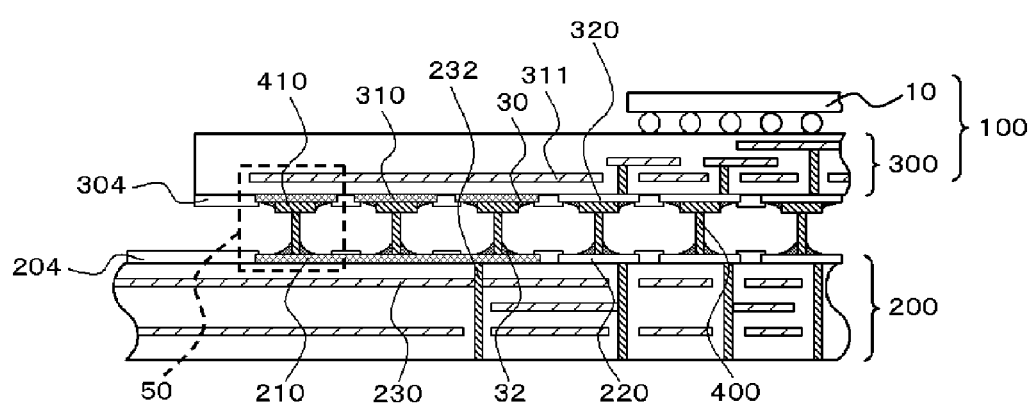
FIG. 2 is a cross-sectional view illustrating a configuration of an electronic device according to a second embodiment.

FIG. 2 is a cross-sectional view illustrating a configuration of an electronic device according to a second embodiment. This electronic device has the same configuration as the electronic device of the first embodiment except for the following points.

First, the second conductor pattern 210 formed in the motherboard 200 is formed in a sheet-like conductor pattern. The first conductor pattern 310 formed in the package interconnect substrate 300 is formed in a plurality of insular conductor patterns. The package interconnect substrate 300 includes the conductor pattern 311 one layer below the first conductor pattern 310. The conductor pattern 311 is connected to the power plane or the ground plane of the motherboard 200, for example, the ground plane through the multilayer interconnect, the via, and the external connection terminal 320 of the package interconnect substrate 300, the connecting member 400, and the external connection terminal 220. The first conductor pattern 310 is electrically isolated from other conductors of the package interconnect substrate 300. A plurality of first conductor patterns 310 are electrically conducted to each other through a plurality of auxiliary connecting members 910 and the second conductor pattern 210.

In the embodiment, the second conductor pattern 210 is connected to the conductor pattern 230 located at an internal interconnect layer of the motherboard 200 through a via 232 formed in the motherboard 200. The conductor pattern 230 is either the power plane or the ground plane of the same type as the plane to which the above-mentioned conductor pattern 311 is not connected, for example, that is, the power plane. Nevertheless, the conductor pattern 230 may be a plane of the same type as the plane, selected from the power plane or the ground plane, to which the conductor pattern 311 is connected. The first insular conductor pattern 310 is not connected to any conductor but the auxiliary connecting member 410.

In the embodiment, the unit cell 50 of the EBG structure 20 is constituted by the first insular conductor pattern 310, the auxiliary connecting member 410, and the region in the sheet-like conductor pattern 311 and the second conductor pattern 210 opposite the first insular conductor pattern 310. Specifically, the second conductor pattern 210 is equivalent to the conductor plane on the lower side, and the conductor pattern 311 is equivalent to the conductor plane on the upper side. The auxiliary connecting member 410 is equivalent to a mushroom-shaped inductance portion, and the first conductor pattern 310 is equivalent to a mushroom-shaped head portion.

In the embodiment, the same effect as that of the first embodiment can also be obtained.

Figure 3:
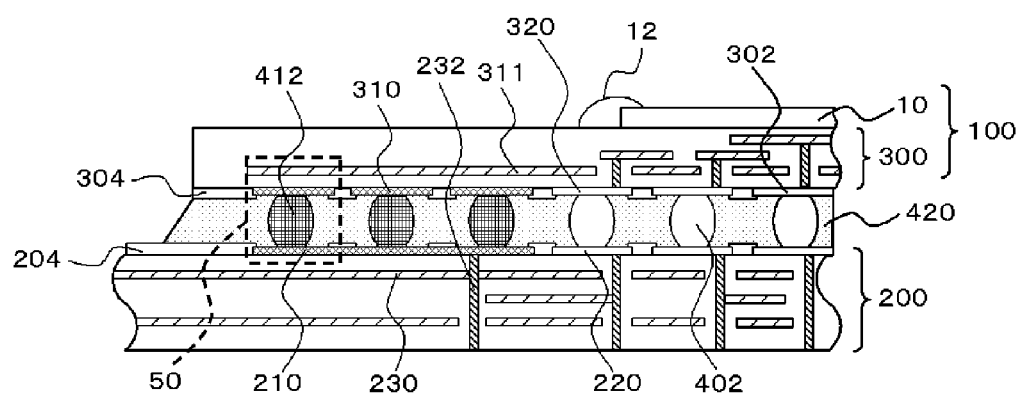
FIG. 3 is a cross-sectional view illustrating a configuration of an electronic device according to a third embodiment.

FIG. 3 is a cross-sectional view illustrating a configuration of an electronic device according to a third embodiment. This electronic device has the same configuration as the electronic device according to the first embodiment or the second embodiment except for the following points. FIG. 3 shows a case similar to the second embodiment.

First, a solder 402 and an EBG solder 412 are used instead of the pin-like connecting member 400 and the auxiliary connecting member 410. The space between the motherboard 200 and the package interconnect substrate 300 is sealed with a resin 420.

In addition, the semiconductor chip 10 is mounted face-up onto the package interconnect substrate 300, and is connected to the package interconnect substrate 300 through a bonding wire 12.

In the embodiment, the same effect as that of the first embodiment can also be obtained. In addition, it is possible to adjust the capacitance component of the EBG structure 20 by adjusting the material of the resin 420. Meanwhile, in the embodiment, the semiconductor chip 10 may be mounted in a flip-chip manner, similarly to the first embodiment and the second embodiment.

Figure 4:
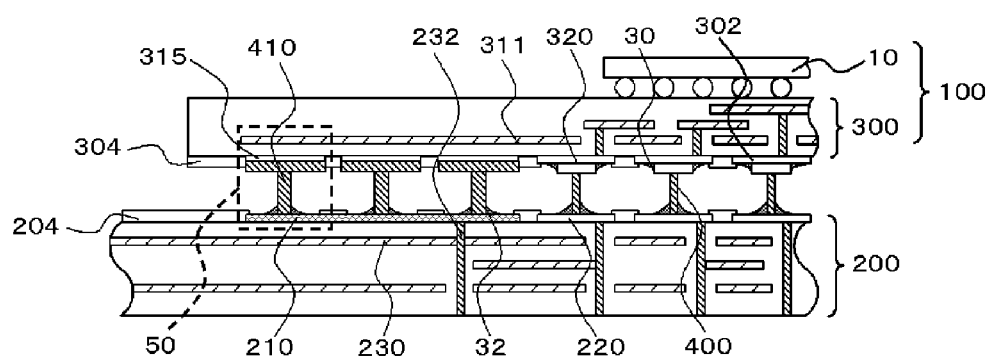
FIG. 4 is a cross-sectional view illustrating a configuration of an electronic device according to a fourth embodiment.

FIG. 4 is a cross-sectional view illustrating a configuration of an electronic device according to a fourth embodiment. This electronic device has the same configuration as the electronic device according to the first embodiment or the second embodiment, except that the shape of the pin-like auxiliary connecting member 410 is different from the shape of the pin-like connecting member 400, and that a dielectric layer 315 is included instead of the first conductor pattern 310. The drawing illustrates a case similar to the second embodiment.

Specifically, the auxiliary connecting member 410 is different from the connecting member 400 in diameter. This makes it possible to expand the range across which the inductance of the auxiliary connecting member 410 can be controlled. The dielectric layer 315 has an adhesive property, and is formed on the surface 302 of the package interconnect substrate 300. The header of the auxiliary connecting member 410 is formed in, for example, a circular or rectangular conductor pattern. It is possible to change the size of the capacitance generated between the header of the auxiliary connecting member 410 and the conductor pattern 311 by changing at least either the size of the header or the thickness of the dielectric layer 315.

In the embodiment, the same effect as that of the first embodiment can also be obtained.

Figure 5:
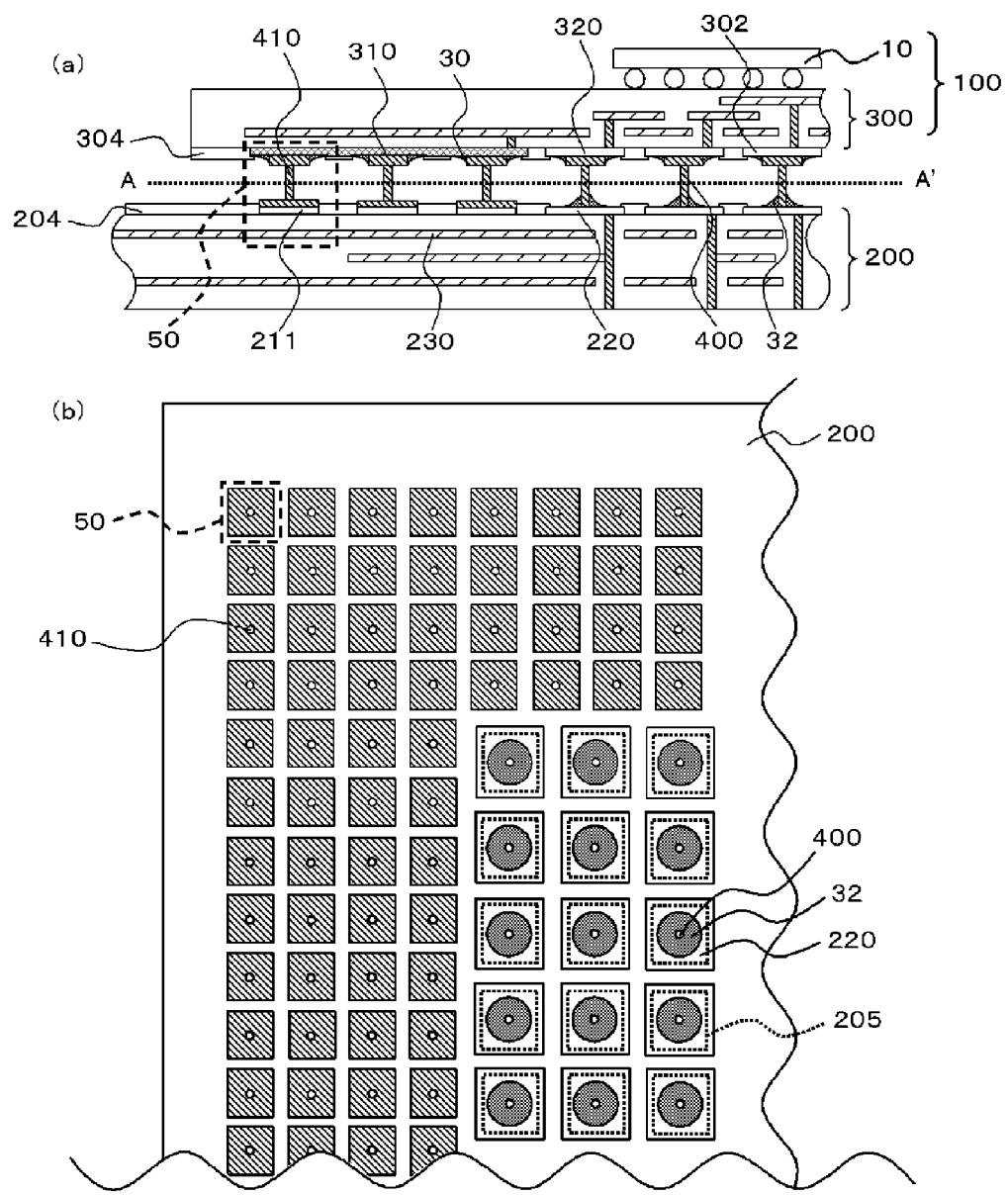
FIG. 5($a$) is a cross-sectional view illustrating a configuration of an electronic device according to a fifth embodiment, and FIG. 5($b$) is a diagram seen downward from the A-A' cross-section of the electronic device shown in FIG. 5($a$).

FIG. 5(a) is a cross-sectional view illustrating a configuration of an electronic device according to a fifth embodiment. FIG. 5(b) is a diagram seen downward from the A-A' cross-section of the electronic device shown in FIG. 5(a), and illustrates a configuration of the surface of the motherboard 200. This electronic device has the same configuration as the electronic device according to the first embodiment except for the following points.

First, the motherboard 200 does not include the second conductor pattern 210. The header of the pin-like auxiliary connecting member 410 is connected to the dielectric layer of the motherboard 200 through a dielectric layer 211, whereas the tip of the pin-like auxiliary connecting member 410 is connected to the first conductor pattern 310. The dielectric layer 211 has an adhesive property, and is provided over the entire header of the auxiliary connecting member 410. The header of the auxiliary connecting member 410 is formed in, for example, a circular or rectangular conductor pattern. It is possible to change the capacitance generated between the header of the auxiliary connecting member 410 and the conductor pattern 230 by changing at least either the size of the header or the thickness of the dielectric layer 211. In addition, the planar shape of the header of the auxiliary connecting member 410 is different from the planar shape of the external connection terminal 220. For this reason, the capacitance generated between the header of the auxiliary connecting member 410 and the conductor pattern 230 can be changed in a wider range.

In the embodiment, the same effect as the semiconductor device according to the first embodiment can also be obtained.

The capacitor is formed by the auxiliary connecting member 410, the dielectric layer 211, the dielectric layer of the motherboard 200, and the conductor pattern 230. This capacitance can be controlled by the dielectric constant and the thickness of the dielectric layer 211. This makes it possible to expand the range across which the characteristics of the EBG structure 20 can be adjusted.

Figure 6:
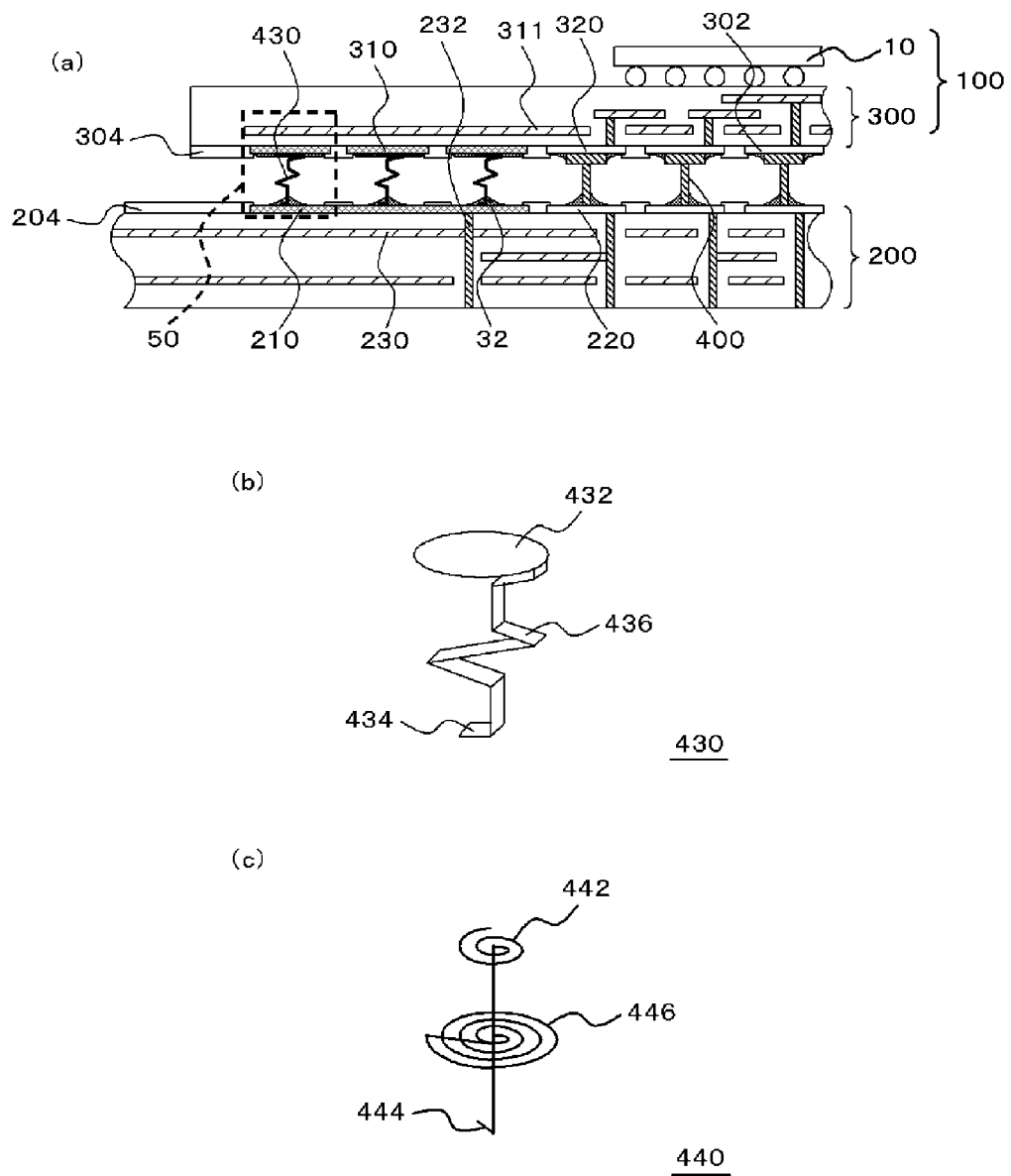
FIG. 6($a$) is a cross-sectional view illustrating a configuration of an electronic device according to a sixth embodiment.

FIG. 6(a) is a cross-sectional view illustrating a configuration of an electronic device according to a sixth embodiment, and FIG. 6(b) is a perspective view illustrating a configuration of an auxiliary connecting member 430 used for the electronic device of FIG. 6(a). The electronic device according to the embodiment has the same configuration as those of the first to fifth embodiments, except that the auxiliary connecting member 430 including a meandering portion 436 is used instead of the linear auxiliary connecting member 410. FIG. 6(a) illustrates a case similar to the second embodiment.

The auxiliary connecting member 430 includes the meandering portion 436 between a header 432 and a tip 434. The meandering portion 436 meanders, and thus, the distance between the header 432 and the tip 434 increases.

In the embodiment, the same effect as that of the first embodiment can also be obtained. In addition, since the auxiliary connecting member 430 includes the meandering portion 436, it is possible to adjust the inductance value for determining the characteristics of the EBG structure 20 by adjusting the shape of the meandering portion 436.

Meanwhile, an auxiliary connecting member 440 shown in FIG. 6(c) may be used instead of the auxiliary connecting member 430. A header 442 of the auxiliary connecting member 440 is spirally formed, and the auxiliary connecting member 440 also includes a spiral portion 446 between the header 442 and a tip 444. In this manner, it is also possible to adjust the inductance value for determining the characteristics of the EBG structure 20 by adjusting the length of the spiral.

Figure 7:
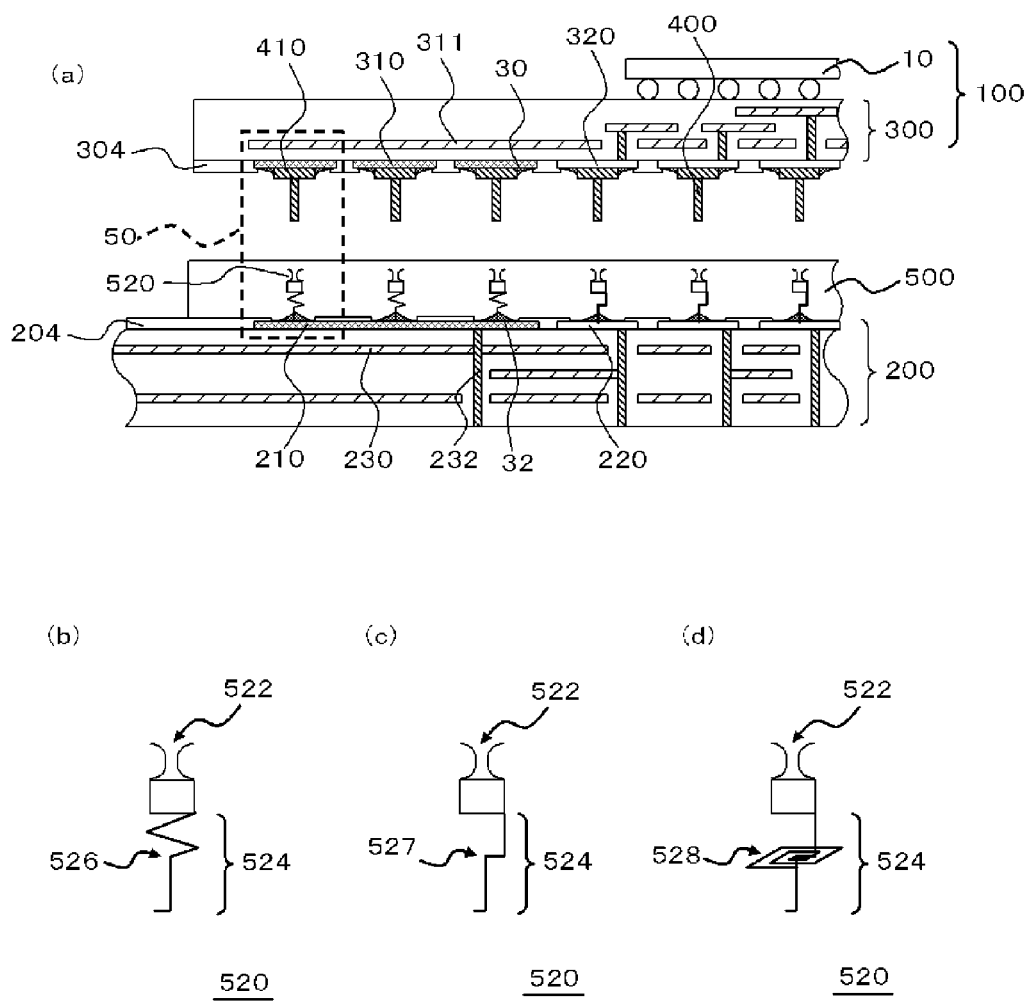

FIG. 7(a) is a cross-sectional view illustrating a configuration of an electronic device according to a seventh embodiment, and FIG. 7(b) is a diagram illustrating a configuration of connection portions 520 of a socket 500 used for the electronic device of FIG. 7(a). The electronic device according to the embodiment has the same configuration as the electronic device shown in the second embodiment, except that the electronic device includes the socket 500. That is, in the embodiment, the socket 500 is fixed onto the motherboard 200, and the pin-like auxiliary connecting member 410 is removably inserted into the socket 500.

The socket 500 includes the connection portions 520. The connection portion 520 is provided corresponding to each of a plurality of auxiliary connecting member 410, and includes an insertion portion 522 and an interconnect 524. The auxiliary connecting member 410 is inserted into the insertion portion 522. One end of the interconnect 524 is connected to the auxiliary connecting member 410 through the insertion portion 522, and the other end of the interconnect 524 is fixed to the second conductor pattern 210 of the motherboard 200 by the solder 32.

Meanwhile, the connection portion 520 is also provided to each of the connecting members 400. The connection portion 520 corresponding to the connecting member 400 is configured so that the other end of the interconnect 524 is fixed to the external connection terminal 220 of the motherboard 200 by the solder 32. In this manner, a plurality of connection portions 520 are incorporated in one socket, but the shapes of a plurality of connection portions 520 may be unified, and a plurality of types having different shapes may be mixed.

The interconnect 524 includes a meandering portion 526 for the purpose of adjusting the inductance. Nevertheless, the interconnect 524 may include a bending portion 527 instead of the meandering portion 526 as shown in FIG. 7(c), and may include a spiral portion 528 as shown in FIG. 7(d).

In the embodiment, the same effect as that of the first embodiment can also be obtained. In addition, the package 100 is removably fixed to the motherboard 200 by the socket 500, and the package 100 is easily exchanged.

Meanwhile, in the embodiment, the configuration of the package 100 and the configuration of the motherboard 200 may have the same configuration of the first embodiment.

Figure 8:
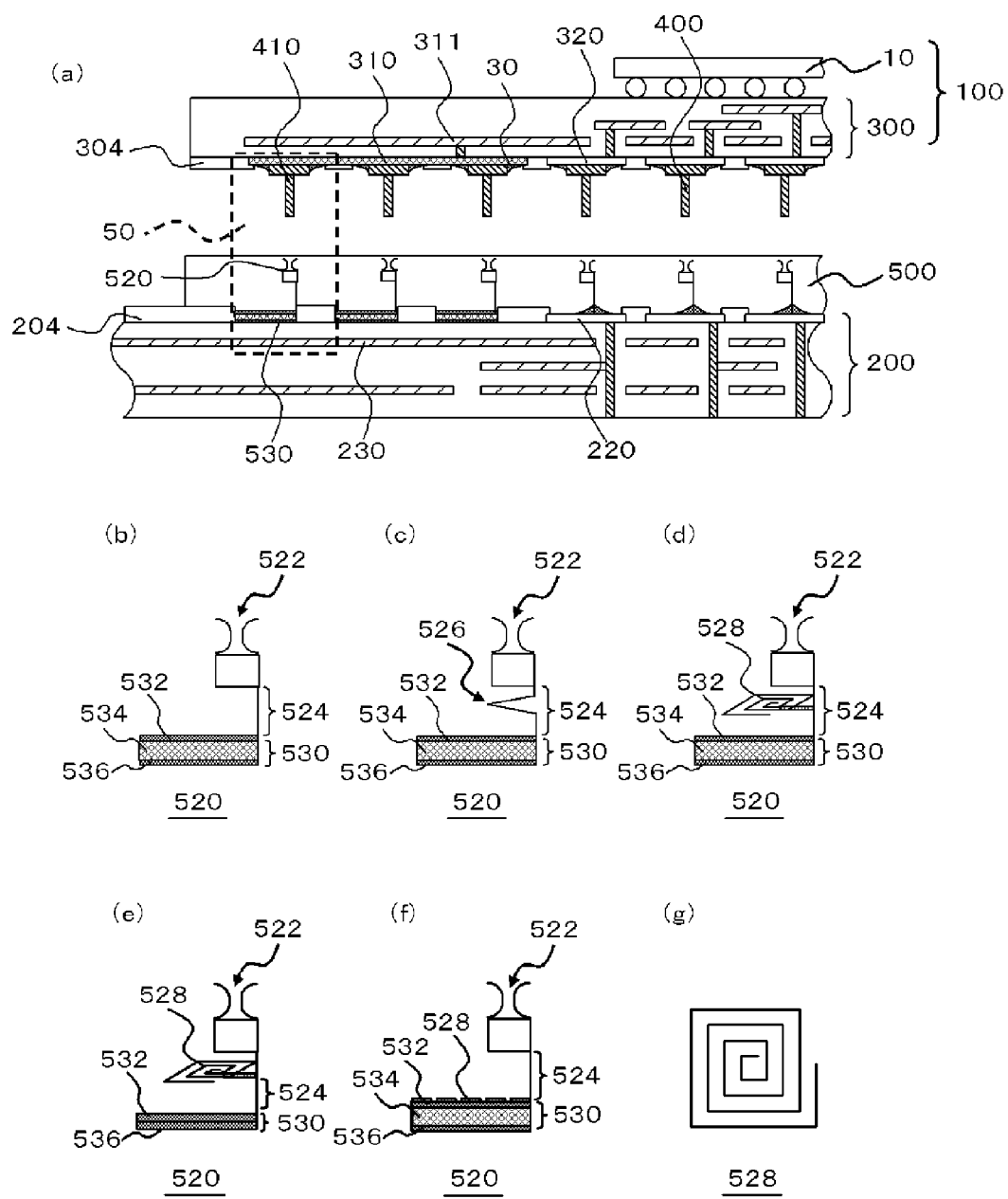

FIG. 8(a) is a cross-sectional view illustrating a configuration of an electronic device according to an eighth embodiment, and FIG. 8(b) is a diagram illustrating a configuration of the connection portion 520 of the socket 500 used for the electronic device of FIG. 8(a). The electronic device according to the embodiment has the same configuration as the electronic device according to the first embodiment except that the electronic device includes the socket 500. The configuration of the socket 500 according to the embodiment has the same configuration as that of the socket 500 shown in the seventh embodiment except that the other end of the interconnect 524 is provided with the capacitor element configuration member 530, and that the first conductor pattern 310 is not insular but is in a sheet shape and is common in a plurality of unit cells 50.

The capacitor element configuration member 530 is opposite the conductor pattern 230 and constitutes a capacitor element. One electrode of this capacitor element is served by the conductor pattern 230. The capacitor element configuration member 530 includes an electrode 532, a dielectric layer 534, and an insulating adhesion layer 536. The upper surface of the electrode 532 is connected to the other end of the interconnect 524. The dielectric layer 534 is provided on the lower surface of the electrode 532. The adhesion layer 536 is provided on the lower surface of the dielectric layer 534. The capacitor element configuration member 530 is fixed to the surface of the motherboard 200 by the adhesion layer 536. Thus, the electrode 532 and the conductor pattern 230 face each other through the dielectric layer 534, the adhesion layer 536, and the dielectric layer of the motherboard 200. As a result, the capacitor element is constituted by these layers.

Meanwhile, in the example shown in FIG. 8(b), the interconnect 524 extends linearly, but may have the meandering portion 526 as shown in FIG. 8(c), and may have the spiral portion 528 as shown in FIG. 8(d). As shown in FIGS. 8(f) and 8(g), the spiral portion 528 may be provided on the electrode 532. As shown in FIG. 8(e), the adhesion layer 536 may be directly provided on the lower surface of the electrode 532 without the dielectric layer 534. In this case, since the gap between the electrode 532 and the conductor pattern 230 narrows by the omitted dielectric layer 534, the capacitance of the capacitor element increases. Meanwhile, in the embodiment, although a plurality of connection portions 520 are also incorporated into one socket, the plurality of connection portions 520 may be unified in shape, and a plurality of types having different shapes may be mixed.

In the embodiment, the same effect as that of the seventh embodiment can also be obtained. In addition, the electrode 532 and the conductor pattern 230 face each other and thus a capacitor element is formed. The capacitance of the capacitor element can be adjusted by, for example, the material and the thickness of the dielectric layer 534. Therefore, the adjustment width of the capacitance component of the EBG structure 20 further increases.

Meanwhile, in the embodiment, the configuration of the package 100 and the configuration of the motherboard 200 may have the same configuration as the second embodiment.

Figure 9:
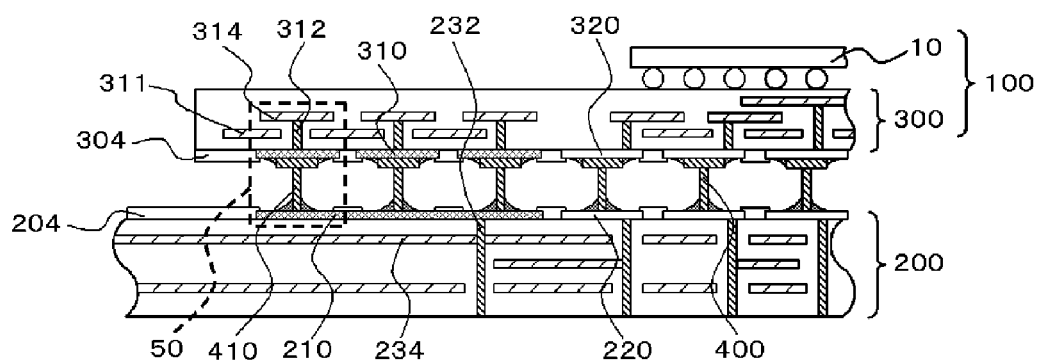
FIG. 9 is a cross-sectional view illustrating a configuration of an electronic device according to a ninth embodiment.

FIG. 9 is a cross-sectional view illustrating a configuration of an electronic device according to a ninth embodiment. This electronic device has the same configuration as the electronic device shown in the second embodiment, except that the unit cell 50 of the EBG structure 20 has a via 312 and a third conductor pattern 314 serving as a third conductor, and that the conductor pattern 311 has an opening.

The via 312 and the third conductor pattern 314 are provided within the multilayer interconnect layer of the package interconnect substrate 300. The third conductor pattern 314 is formed in the interconnect layer one layer below the conductor pattern 311 in the internal interconnect layer of the package interconnect substrate 300, and is provided in an island shape at a position opposite each of the first insular conductor patterns 310 in a plan view. The third conductor pattern 314 is, for example, square, but is not limited thereto. The via 312 passes through the opening provided in the conductor pattern 311, and connects the first conductor pattern 310 to the third conductor pattern 314. The via 312 is provided at a position overlapping the connecting member 400 in a plan view, but is not limited to such a disposition.

In the embodiment, the same effect as that of the second embodiment can also be obtained. In addition, since the unit cell 50 of the EBG structure 20 includes the via 312 and the third conductor pattern 314, the number of adjustment locations of the inductance and the capacitance formed in the unit cell 50 increases, and thus the control range of the band gap frequency range can be extended.

Figure 10:
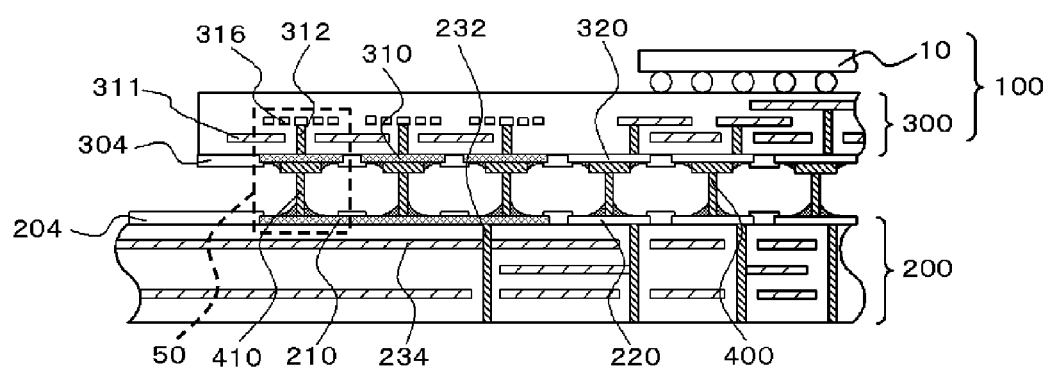
FIG. 10 is a cross-sectional view illustrating a configuration of an electronic device according to a tenth embodiment.

FIG. 10 is a cross-sectional view illustrating a configuration of an electronic device according to a tenth embodiment. This electronic device has the same configuration as the electronic device according to the ninth embodiment, except that the unit cell 50 of the EBG structure 20 includes a stub 316 instead of the third conductor pattern 314. The stub 316 is an interconnect formed in one interconnect layer. In the embodiment, the stub 316 extends in a spiral shape in a region overlapping the first conductor pattern 310 in a plan view.

In the embodiment, the same effect as that of the second embodiment can also be obtained. In addition, since the unit cell 50 of the EBG structure 20 includes the via 312 and the stub 316, the number of adjustment locations of the inductance and the capacitance formed in the unit cell 50 increases, and thus the control range of the band gap frequency range can be extended. Moreover, since the shape of the stub 316 can also be arbitrarily changed, a great degree of freedom is available in the design of the conductor pattern within the package interconnect substrate 300.

Meanwhile, in the first embodiment, a conductor pattern equivalent to the third conductor pattern 314 in the ninth embodiment or a conductor pattern equivalent to the stub 316 in the tenth embodiment may be provided in the internal interconnect layer of the motherboard 200. Also, the conductor pattern and the second insular conductor pattern 210 may be connected to each other through a via. In this manner, the same effect as that of the ninth embodiment or the tenth embodiment can also be obtained.

Figure 11:
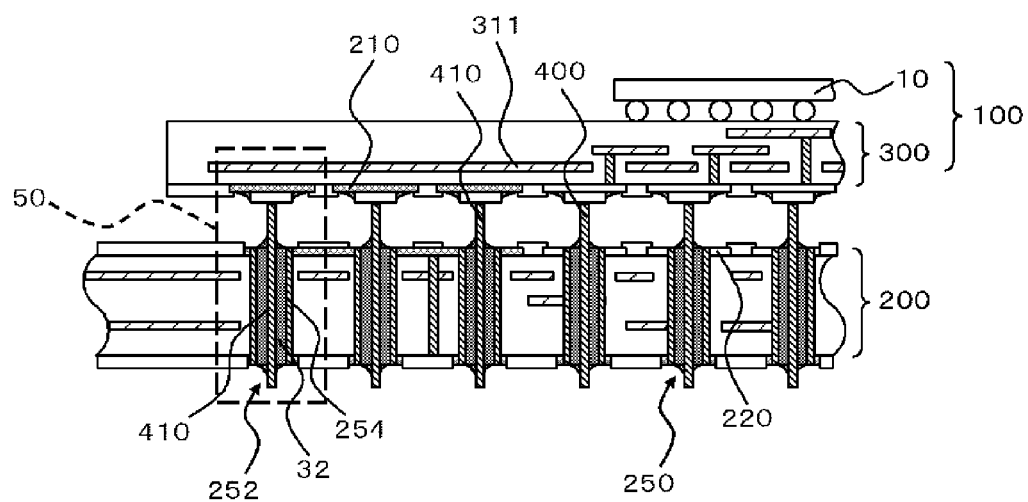
FIG. 11 is a cross-sectional view illustrating a configuration of an electronic device according to an eleventh embodiment.

FIG. 11 is a cross-sectional view illustrating a configuration of an electronic device according to an eleventh embodiment. This electronic device has the same configuration as the electronic device according to the second embodiment, except that the connecting member 400 and the auxiliary connecting member 410 are not a surface-mounted type but is a through-hole mounted type.

Specifically, through-holes 250 and 252 are provided in the motherboard 200. The through-hole 250 is formed to allow insertion of the pin-like connecting member 400. The through-hole 252 is formed to allow insertion of the pin-like auxiliary connecting member 410. The through-hole 250 is provided at a position overlapping the external connection terminal 220 in a plan view. The through-hole 252 is provided at a position overlapping the second conductor pattern 210. A plating layer 254 is provided in the inner walls of the through-holes 250 and 252. The solder 32 is filled inside the through-holes 250 and 252.

In the embodiment, the same effect as that of the second embodiment can also be obtained. In addition, since the inductance of the auxiliary connecting member 410 can be increased, the band gap frequency range of the EBG structure 20 can be shifted to the low frequency side.

Figure 12:
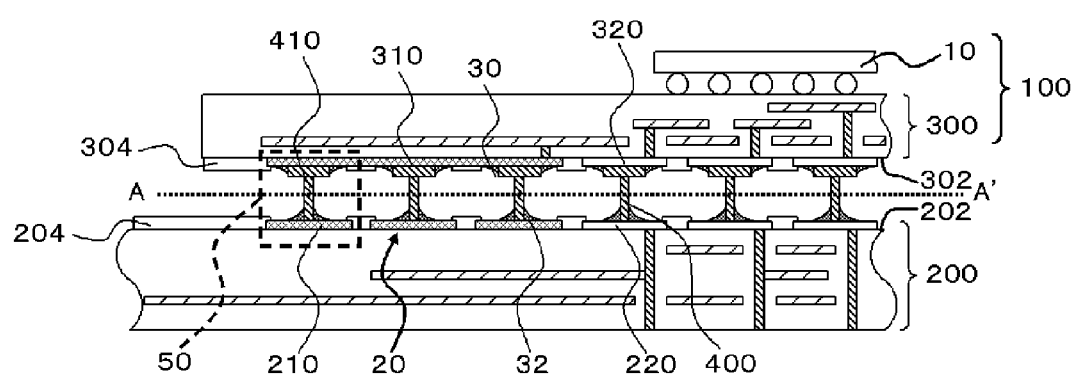
FIG. 12 is a cross-sectional view illustrating a configuration of an electronic device according to a twelfth embodiment.

FIG. 12 is a cross-sectional view illustrating a configuration of an electronic device according to a twelfth embodiment. This electronic device has the same configuration as the electronic device according to the first embodiment, except that the electronic device does not include the conductor pattern 230.

In the embodiment, the unit cell 50 of the EBG structure 20 is constituted by the second insular conductor pattern 210, the auxiliary connecting member 410, and the region in the first sheet-like conductor pattern 310 opposite the second insular conductor pattern 210. In such a configuration, the capacitor is formed between the second conductor patterns 210 adjacent to each other, and thus the propagation of noise is suppressed in the vicinity of the mushroom, that is, the vicinity of the auxiliary connecting member 410 and the second conductor pattern 210. The auxiliary connecting member 410 is located between the motherboard 200 and the package interconnect substrate 300. The second conductor pattern 210 is formed in the motherboard 200. Therefore, it is possible to suppress the noise propagation in each of the backside of the package interconnect substrate 300 and the surface of the motherboard 200, and to suppress the emission of noise to the outside by the propagation of noise through the space between the motherboard 200 and the package interconnect substrate 300.

Figure 13:
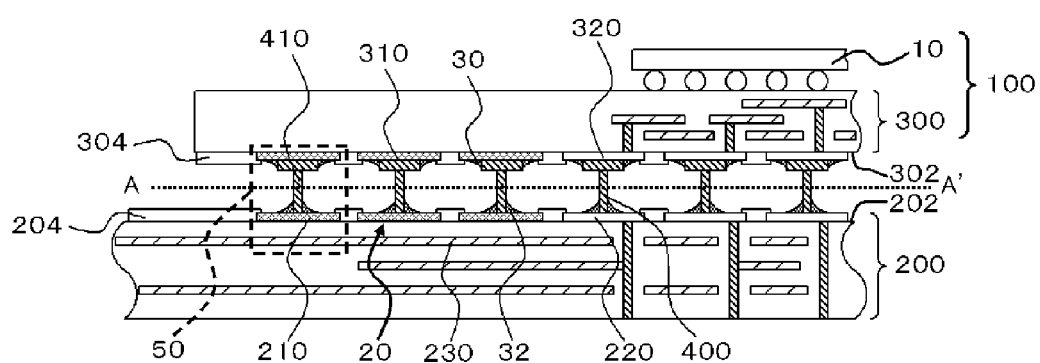
FIG. 13 is a cross-sectional view illustrating a configuration of an electronic device according to a thirteenth embodiment.

FIG. 13 is a cross-sectional view illustrating a configuration of an electronic device according to a thirteenth embodiment. This electronic device has the same configuration as that of the first embodiment, except that the first conductor pattern 310 is insular and is not connected to any element but the auxiliary connecting member 410, and that the electronic device does not include the conductor pattern 311. The first insular conductor patterns 310 are the same as, for example, the second conductor patterns 210 in planar shape, and overlap each other in a plan view.

In the embodiment, the unit cell 50 of the EBG structure 20 is constituted by the first insular conductor pattern 310, the second insular conductor pattern 210, and the region in the sheet-like conductor pattern 230 opposite the second conductor pattern 210. In such a configuration, a first capacitor is formed between the first conductor patterns 310 adjacent to each other. A second capacitor is formed between the second conductor patterns 210 adjacent to each other. A third capacitor is formed between the conductor pattern 230 and the second conductor pattern 210. The auxiliary connecting member 410 functions as an inductance element.

In the EBG structure 20 according to the embodiment, the propagation of noise is suppressed in the vicinity of the auxiliary connecting member 410, the first conductor pattern 310, and the second conductor pattern 210. Therefore, it is possible to suppress the noise propagation in each of the backside of the package interconnect substrate 300 and the surface of the motherboard 200, and to suppress the emission of noise to the outside by the propagation of noise through the space between the motherboard 200 and the package interconnect substrate 300. As mentioned above, the first capacitor, the second capacitor, and the third capacitor are included between the unit cells 50, and the embodiment has a wider variety of capacitors formed between the unit cells 50 than the twelfth embodiment. Therefore, the adjustment width of the band gap frequency range of the EBG structure 20 can be increased.

Figure 14:
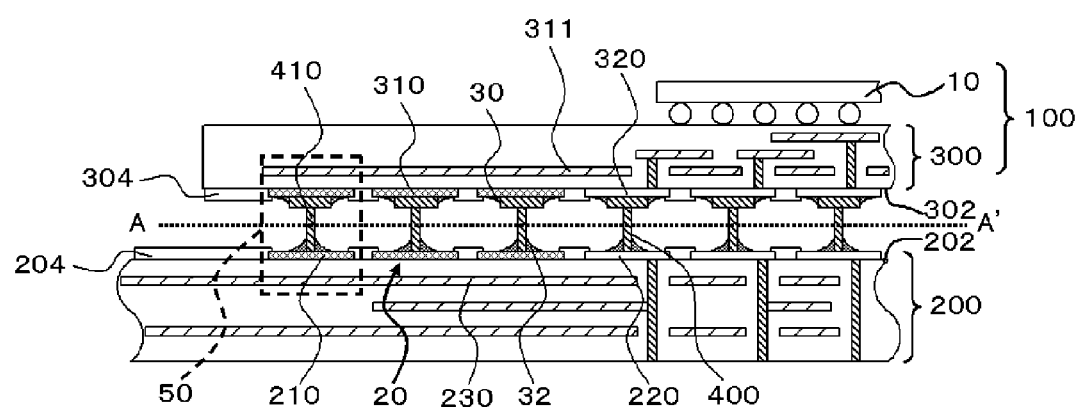
FIG. 14 is a cross-sectional view illustrating a configuration of an electronic device according to a fourteenth embodiment.

FIG. 14 is a cross-sectional view illustrating a configuration of an electronic device according to a fourteenth embodiment. This electronic device has the same configuration as the electronic device according to the thirteenth embodiment, except that the package interconnect substrate 300 includes the sheet-like conductor pattern 311.

In the embodiment, the unit cell 50 of the EBG structure 20 is constituted by the first insular conductor pattern 310, the second insular conductor pattern 210, the region in the sheet-like conductor pattern 230 opposite the second conductor pattern 210, and the region in the conductor pattern 311 opposite the first conductor pattern 310. In such a configuration, a first capacitor is formed between the first conductor patterns 310 adjacent to each other. A second capacitor is formed between the second conductor patterns 210 adjacent to each other. A third capacitor is formed between the conductor pattern 230 and the second conductor pattern 210. A fourth capacitor is formed between the conductor pattern 311 and the first conductor pattern 310. The auxiliary connecting member 410 functions as an inductance element.

In the EBG structure 20 according to the embodiment, noise is prevented from propagating between the conductor pattern 230 and the first conductor pattern 310 is suppressed. In addition, there are many kinds of capacitor elements included in the unit cell 50. Therefore, the adjustment width of the band gap frequency range of the EBG structure 20 can be increased.

Figure 15:
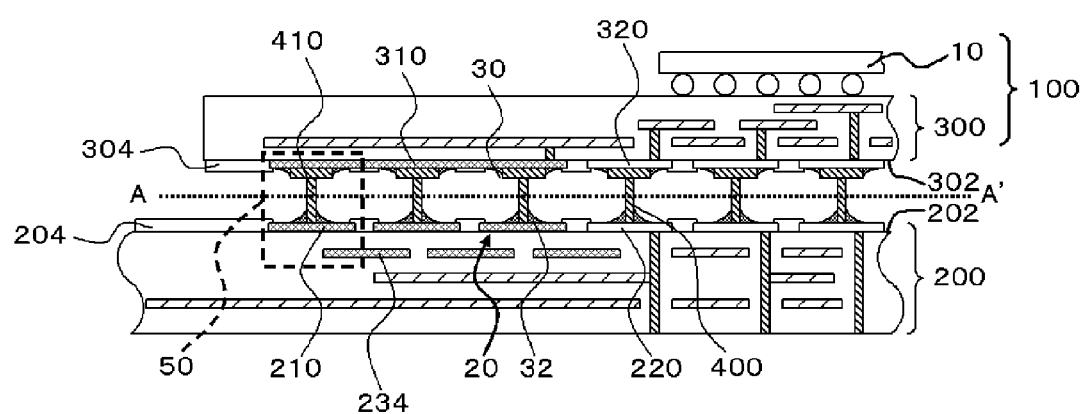
FIG. 15 is a cross-sectional view illustrating a configuration of an electronic device according to a fifteenth embodiment.

FIG. 15 is a cross-sectional view illustrating a configuration of an electronic device according to a fifteenth embodiment. This electronic device has the same configuration as the electronic device of the twelfth embodiment, except that the motherboard 200 includes an insular conductor pattern 234.

The insular conductor pattern 234 is formed in the layer below the second conductor pattern 210, for example, in the conductor layer one layer below the second conductor pattern 210. The conductor pattern 234 is periodically disposed, and is located so as to fill the gaps between the second insular conductor patterns 210 in a plan view. One conductor pattern 234 overlaps two second conductor patterns 210 adjacent to each other. The planar shape of the conductor pattern 234 is, for example, rectangular, but is not limited thereto. The center-to-center distance between the conductor patterns 234 adjacent to each other is the same as the center-to-center distance between the second conductor patterns 210 adjacent to each other.

In the embodiment, the unit cell 50 of the EBG structure 20 is constituted by the second insular conductor pattern 210, the auxiliary connecting member 410, the region in the sheet-like first conductor pattern 310 opposite the second insular conductor pattern 210, and the conductor pattern 234. The capacitance is formed between each of the second conductor patterns 210 adjacent to each other and the conductor patterns 234. This capacitance can be controlled by adjusting the area in which the second conductor pattern 210 and the conductor pattern 234 overlap each other. This makes it possible to increase the adjustment width of the band gap frequency range of the EBG structure 20.

Figure 16:
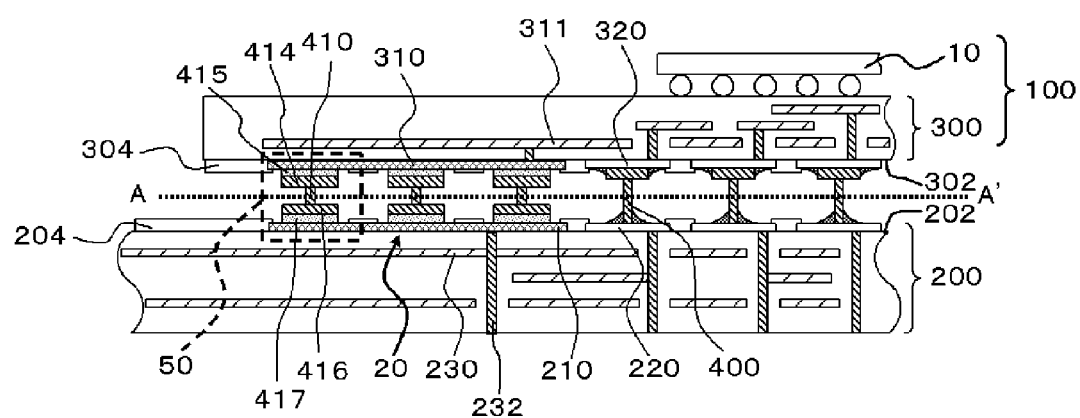
FIG. 16 is a cross-sectional view illustrating a configuration of an electronic device according to a sixteenth embodiment.

FIG. 16 is a cross-sectional view illustrating a configuration of an electronic device according to a sixteenth embodiment. This electronic device has the same configuration as the electronic device according to the first embodiment, except for the following points.

First, the auxiliary connecting member 410 includes a header 414 on its one end, and includes a header 416 on the other end. The header 416 is formed in, for example, a circular or rectangular conductor pattern, and has, for example, the same planar shape as that of the header 414.

In addition, the second conductor pattern 210 is sheet-like similarly to the first conductor pattern 310, and extends over substantially the entire region in which the EBG structure 20 is to be formed. The second conductor pattern 210 is connected to the conductor pattern 230 through the via 232. The header 414 of the auxiliary connecting member 410 is in proximity to the first conductor pattern 310 through a dielectric layer 415. The header 416 is in proximity to the second conductor pattern 210 through a dielectric layer 417. The dielectric layers 415 and 417 have an adhesive property, and fix the auxiliary connecting member 410 to the package interconnect substrate 300 and the motherboard 200.

In such a configuration, the unit cell 50 of the EBG structure 20 is formed by the first conductor pattern 310, the dielectric layer 415, the auxiliary connecting member 410, the dielectric layer 417, and the second conductor pattern 210. A first capacitor is formed by the first conductor pattern 310, the dielectric layer 415, and the header 414 of the auxiliary connecting member 410. A second capacitor is formed by the second conductor pattern 210, the dielectric layer 417, and the header 416 of the auxiliary connecting member 410. The first capacitor and the second capacitor are connected to each other through the inductance portion of the auxiliary connecting member 410. The first capacitor, the inductance portion, and the second capacitor are repeatedly provided, and thereby the band range frequency band is set.

In the embodiment, the same configuration as that of the first embodiment can also be obtained. In addition, the auxiliary connecting member 410 can be fixed to the package interconnect substrate 300 and the motherboard 200 without using solder. The first and second capacitances of the unit cell 50 are increased by decreasing the thicknesses of the dielectric layers 415 and 417, and the band gap frequency range of the EBG structure 20 is allowed to be lowered.

Figure 17:
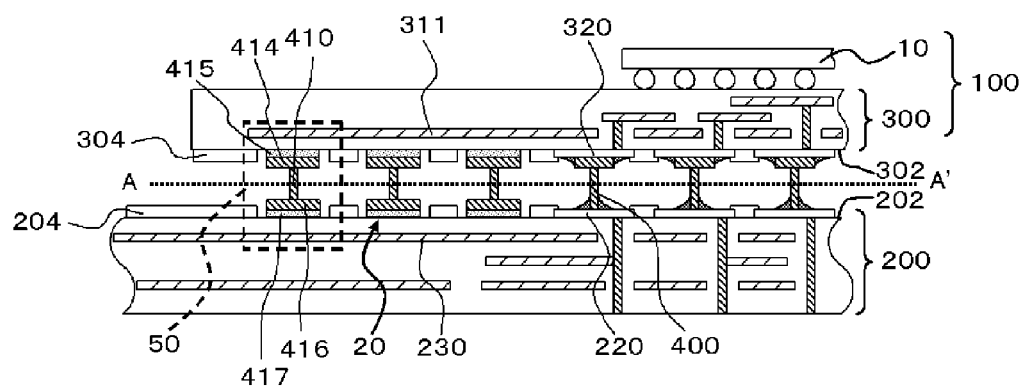
FIG. 17 is a cross-sectional view illustrating a configuration of an electronic device according to a seventeenth embodiment.

FIG. 17 is a cross-sectional view illustrating a configuration of an electronic device according to a seventeenth embodiment. This electronic device has the same configuration as the electronic device according to the sixteenth embodiment, except for the following points.

First, the package interconnect substrate 300 does not include the first conductor pattern 310. The header 414 of the auxiliary connecting member 410 is directly fixed to the insulating layer of the package interconnect substrate 300 through the dielectric layer 415. The motherboard 200 does not include the second conductor pattern 210. The header 416 of the auxiliary connecting member 410 is directly fixed to the insulating layer of the motherboard 200 through the dielectric layer 417.

In a region in which the auxiliary connecting member 410 is disposed in a plan view, the conductor pattern 311 and the conductor pattern 230 extend in a sheet shape. The conductor pattern 311 is connected to either the power supply pattern or the ground pattern of the motherboard 200. The conductor pattern 230 is connected to the other either the power supply pattern or the ground pattern of the motherboard 200.

In such a configuration, the unit cell 50 of the EBG structure 20 is formed by the conductor pattern 311, the insulating layer within the package interconnect substrate 300, the dielectric layer 415, the auxiliary connecting member 410, the dielectric layer 417, the insulating layer within the motherboard 200, and the conductor pattern 230. A first capacitor is formed by the conductor pattern 311, the insulating layer within the package interconnect substrate 300, the dielectric layer 415, and the header 414 of the auxiliary connecting member 410. A second capacitor is formed by the conductor pattern 230, the insulating layer within the motherboard 200, the dielectric layer 417, and the header 416 of the auxiliary connecting member 410. The first capacitance and second capacitance are connected to each other through the inductance portion of the auxiliary connecting member 410.

In the embodiment, the same configuration as that of the first embodiment can also be obtained. In addition, the auxiliary connecting member 410 can be fixed to the package interconnect substrate 300 and the motherboard 200 without using solder.

Figure 18:
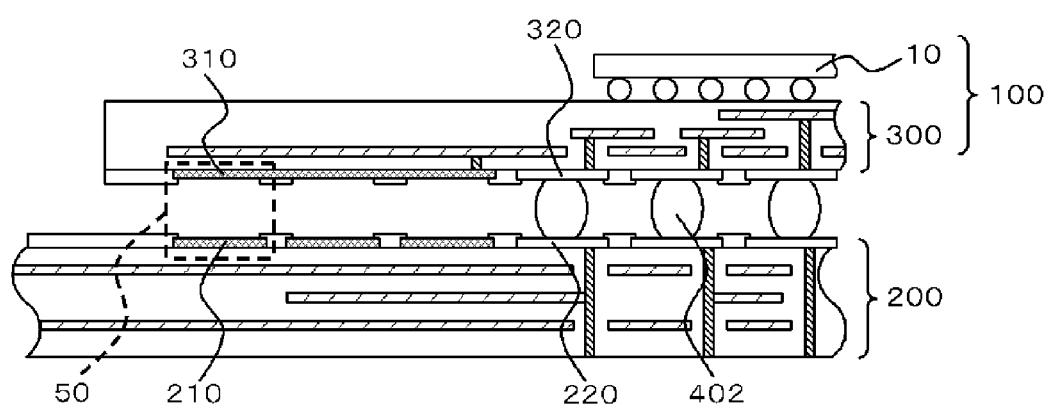
FIG. 18 is a cross-sectional view illustrating a configuration of an electronic device according to an eighteenth embodiment.

FIG. 18 is a cross-sectional view illustrating a configuration of an electronic device according to an eighteenth embodiment. This electronic device has the same configuration as the electronic device according to the first embodiment, except that the unit cell 50 of the EBG structure 20 has a different structure, and that the solder 402 is used instead of the connecting member 400.

Figure 19:
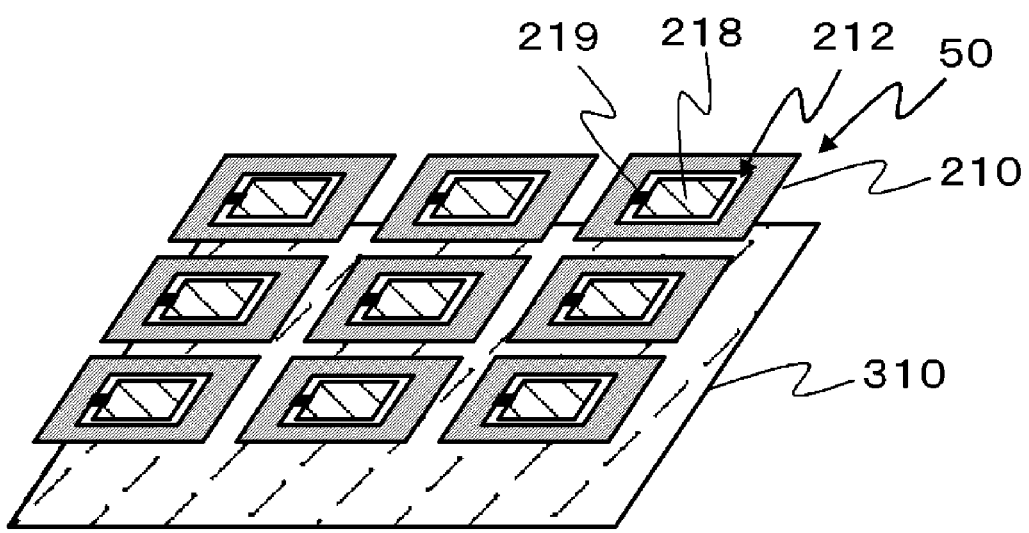
FIG. 19 is a perspective view schematically illustrating a configuration of an EBG structure according to the embodiment.

FIG. 19 is a perspective view schematically illustrating a configuration of the EBG structure 20 according to the embodiment. Meanwhile, for the purposes of illustration, the drawing is shown upside down with respect to FIG. 18. In the embodiment, in the unit cell 50 of the EBG structure 20, an opening 212 is provided in the second insular conductor pattern 210. Also in the unit cell 50, a fourth insular conductor pattern 218 serving as a fourth conductor is disposed within the opening 212. Further, in the unit cell 50, the fourth conductor pattern 218 and the second conductor pattern 210 are connected to each other through an interconnect 219.

In the unit cell 50, a parasitic capacitance CR is formed between the first conductor pattern 310 and the second conductor pattern 210. A first capacitance C1 is formed by the second conductor patterns 210 adjacent to each other. A second capacitance C2 is formed between the fourth conductor pattern 218 and the second conductor pattern 210. Each of the first conductor patterns 310 has a parasitic inductance LR. The interconnect 219 provides an inductance LL between the second conductor pattern 210 and the fourth conductor pattern 218. That is, the equivalent circuit of the unit cell 50 is the same as the equivalent circuit of the mushroom structure.

In the embodiment, the same effect as that of the first embodiment can also be obtained. In addition, since the EBG structure 20 can be formed by patterning of the conductor without the need for providing the auxiliary connecting member 410, the manufacturing variation of the EBG structure 20 can be reduced.

Figure 20:
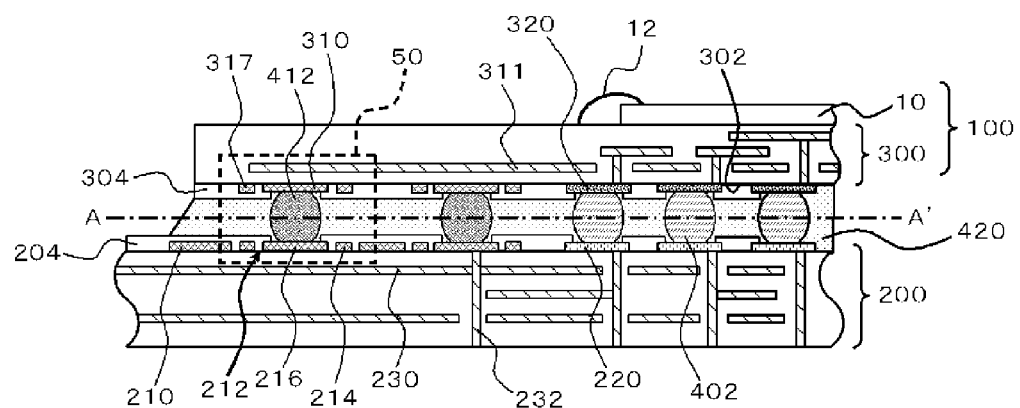
FIG. 20 is a cross-sectional view illustrating a configuration of an electronic device according to a nineteenth embodiment.

FIG. 20 is a cross-sectional view illustrating a configuration of an electronic device according to a nineteenth embodiment. This electronic device has the same configuration as the electronic device according to the third embodiment, except for the following points.

First, the opening 212 is formed in the second conductor pattern 210 of the motherboard 200. The opening 212 is formed in a region in the second conductor pattern 210 opposite the EBG solder 412 and in its periphery. A connection conductor 216 is provided within the opening 212. The connection conductor 216 is opposite the EBG solder 412, and is connected to the EBG solder 412 through the opening provided in the resist layer 204.

Figure 21:
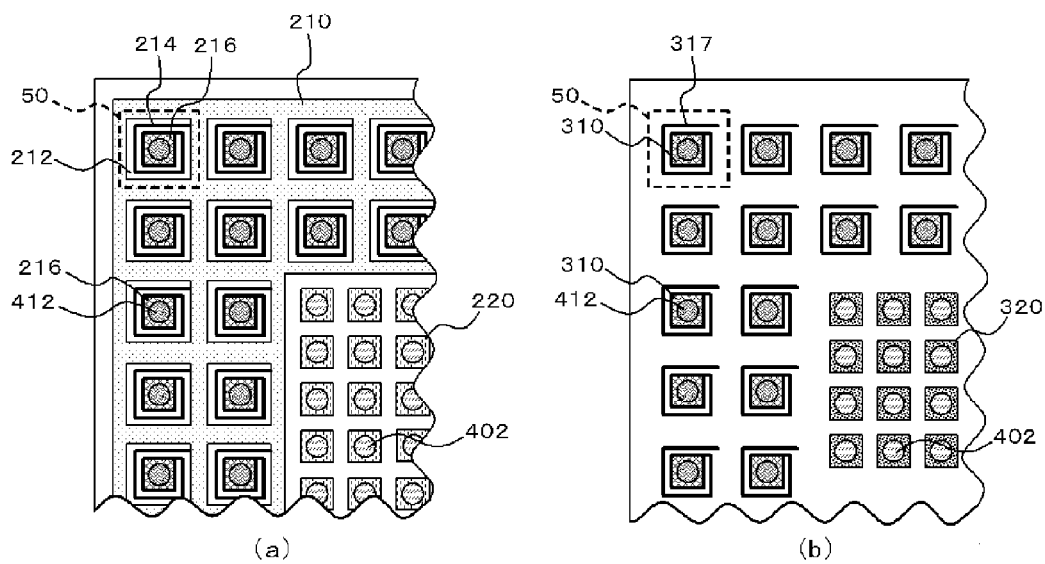
FIG. 21(a) is a diagram seen downward from the A-A' cross-section of FIG. 20.
FIG. 21(b) is a diagram seen upward from the A-A' cross-section of FIG. 20.

A second interconnect 214 is provided within the opening 212. One end of the second interconnect 214 (shown in FIG. 21) is connected to the margin of the opening 212. The other end of the second interconnect 214 (shown in FIG. 21) is connected to the connection conductor 216. That is, the connection conductor 216 is connected to the second conductor pattern 210 through the second interconnect 214.

A third interconnect 317 is provided in the package interconnect substrate 300. The third interconnect 317 is formed in the layer of the first conductor pattern 310. One end of the third interconnect 317 (shown in FIG. 21) is connected to the first conductor pattern 310. The other end of the third interconnect 317 (shown in FIG. 21) is an open end.

FIG. 21(a) is a diagram seen downward from the A-A' cross-section of FIG. 20, and shows a configuration of the surface of the motherboard 200. In the drawing, the resist layer 204 is not shown. The opening 212 and the connection conductor 216 are similar to each other, and are concentric with each other. In the example shown in the drawing, the opening 212 and the connection conductor 216 are rectangular. Nevertheless, the opening 212 and the connection conductor 216 need not be similar to each other. The second interconnect 214 extends in a spiral shape so as to surround the connection conductor 216. Nevertheless, the shape of the second interconnect 214 is not limited to the example shown in the drawing.

FIG. 21(b) is a diagram seen upward from the A-A' cross-section of FIG. 20, and shows a configuration of the surface of the package interconnect substrate 300. In the drawing, the resist layer 304 is not shown. The third interconnect 317 extends in a spiral shape so as to surround the first conductor pattern 310. Nevertheless, the shape of the third interconnect 317 is not limited to the example shown in the drawing.

The third interconnect 317 is electrically coupled to the opposite second conductor pattern 210, and thus forms a microstrip line using the second conductor pattern 210 serving as a return path. One end of the third interconnect 317 is an open end. For this reason, one end of the above-mentioned microstrip line is an open end, and as a result, the microstrip line functions as an open stub. The unit cell 50 can be expressed by an equivalent circuit in which a parallel plate formed of the first conductor pattern 310 and the second conductor pattern 210 is shunted by the open stub. The first conductor pattern 310 and the second conductor pattern 210 are short-circuited to each other in the resonance frequency of the open stub. Since the short-circuited frequency can be controlled by the stub length of the open stub, the adjustment is facilitated, and the size of the unit cell 50 can be reduced.

In the embodiment, the same effect as that of the third embodiment can also be obtained. In addition, since the second interconnect 214 is provided, the inductance of the unit cell 50 can be increased. Since the capacitor is also formed between the connection conductor 216 and the second conductor pattern 210, the adjustment width of the capacitance of the unit cell 50 can be increased.

The connection conductor 216 is separated from the second conductor pattern 210, and thus when the EBG solder 412 is bonded to the connection conductor 216, the connection conductor 216 is easily warmed up.

Since the third interconnect 317 is provided in the first conductor pattern 310, the inductance of the unit cell 50 can be increased.

Figure 22:
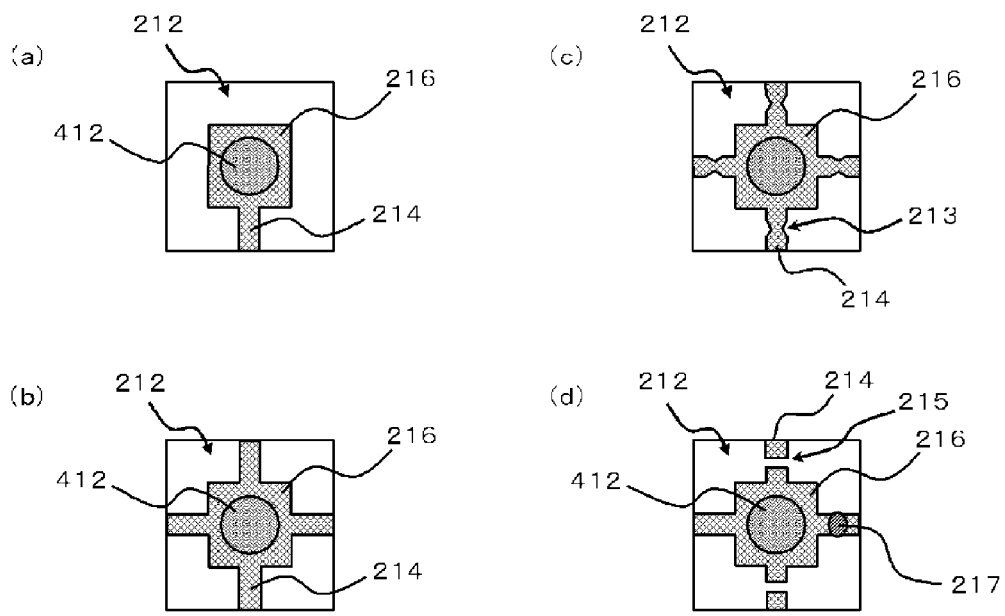
FIG. 22 is a diagram illustrating a modified example of a second interconnect according to the nineteenth embodiment.

Each drawing of FIG. 22 is a diagram illustrating a modified example of the second interconnect 214 according to the nineteenth embodiment. In the example shown in FIG. 22(*a*), the second interconnect 214 is formed in a straight line and connects one side of the connection conductor 216 to the margins of the opening 212 opposite the one side.

In the example shown in FIG. 22(*b*), the second interconnect 214 is provided to each of four sides of the connection conductor 216. Each of the second interconnects 214 is formed in a straight line and connects one side of the connection conductor 216 to the margins of the opening 212 opposite the one side.

The example shown in FIG. 22(*c*) is the same as the example shown in FIG. 22(*b*), except that a severable portion 213 is provided in each of the second interconnects 214. The severable portion 213 is thinner than other portions of the second interconnect 214, and is exposed from the resist layer 204 through an opening (not shown) provided in the resist layer 204. For this reason, the second interconnect 214 is capable of being severed in the severable portion 213. In this case, it is possible to adjust the frequency characteristics of the unit cell 50 by adjusting the number of second interconnects 214 severed, that is, disconnected at the severable portion 213.

The example shown in FIG. 22(*d*) is the same as the example shown in FIG. 22(*b*), except that at least one of the second interconnects 214 is previously disconnected by a disconnection portion 215. The disconnection portion 215 is exposed from the resist layer 204 through an opening provided in the resist layer 204. A conductor 217, for example, a conductive paste or solder is buried in this opening, and as a result, the disconnection portion 215 is filled. Thus, both ends of the second interconnect 214 is allowed to be short-circuited to each other. In this case, it is possible to adjust the frequency characteristics of the unit cell 50 by filling the disconnection portion 215 and adjusting the number of second interconnects 214 of which both ends are short-circuited to each other.

Figure 23:
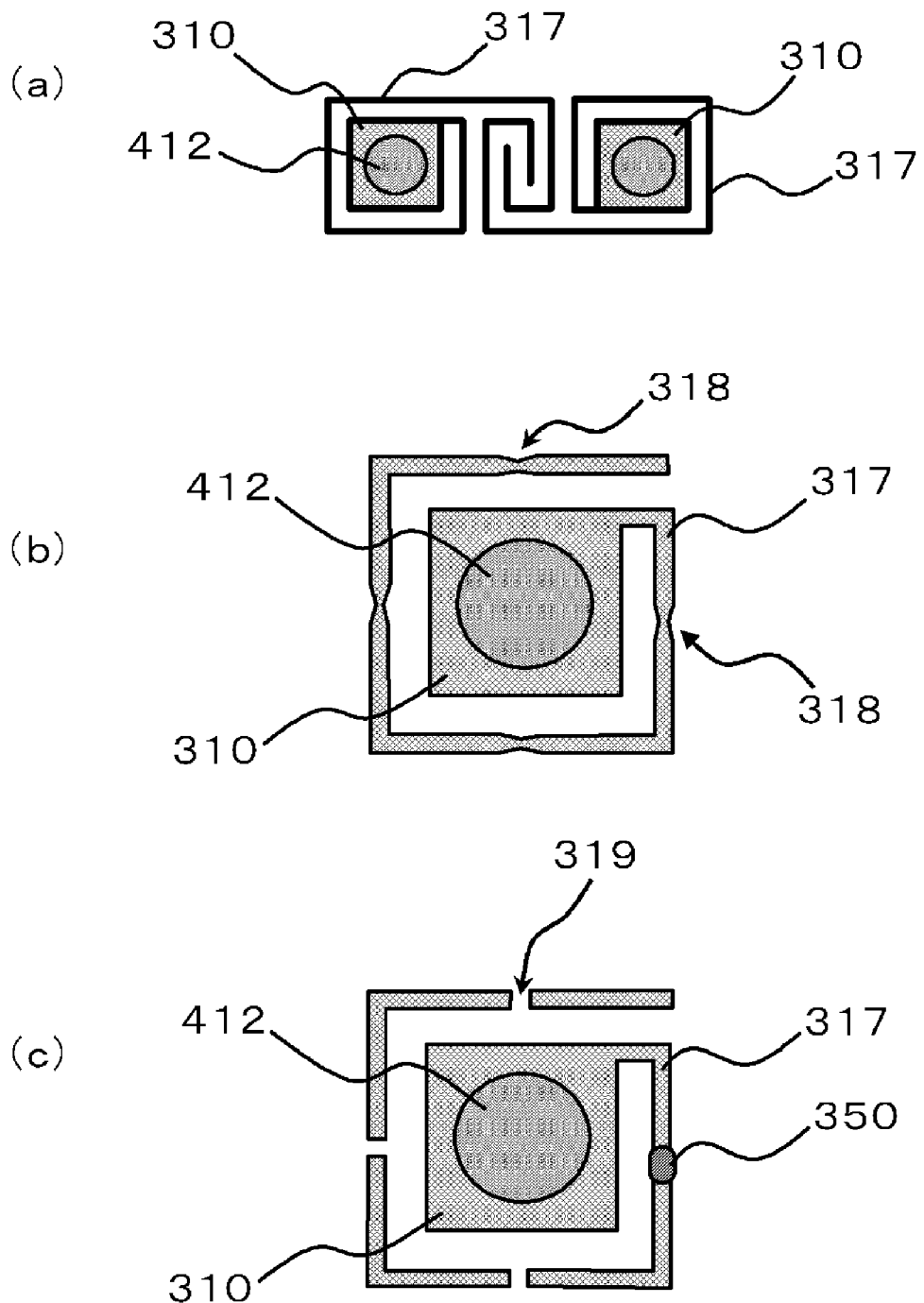
FIG. 23 is a diagram illustrating a modified example of a third interconnect according to the nineteenth embodiment.

Each drawing of FIG. 23 is a diagram illustrating a modified example of the third interconnect 317 according to the nineteenth embodiment. In the example shown in FIG. 23(*a*), the third interconnects 317 adjacent to each other extend so as to form a spiral while its open end sides overlap each other, and not to be short-circuited to each other. In this manner, it is possible to adjust the degree of interference of the adjacent unit cell 50. When the degree of interference of the adjacent unit cell 50 is adjusted, the inductance and the capacitance of unit cell 50 are adjusted, and as a result, the frequency characteristics of the unit cell 50 can be adjusted.

In the example shown in FIG. 23(*b*), the third interconnect 317 includes at least one severable portion 318. The severable portion 318 is thinner than other portions of the third interconnect 317, and is exposed from the resist layer 304 through an opening (not shown) provided in the resist layer 304. For this reason, the third interconnect 317 is capable of being severed at the severable portion 318. In this case, since the effective length of the third interconnect 317 changes by adjusting places severed, that is, disconnected at the severable portion 318, the frequency characteristics of the unit cell 50 can be adjusted.

In the example shown in FIG. 23(*c*), the third interconnect 317 includes at least one disconnection portion 319. The disconnection portion 319 is exposed from the resist layer 304 through an opening provided in the resist layer 304. A conductor 350, for example, a conductive paste or solder is buried in this opening, and as a result, the disconnection portion 319 is filled. Thus, the effective length of the third interconnect 317 is allowed to be increased. In this case, the frequency characteristics of the unit cell 50 can also be adjusted.

Figure 24:
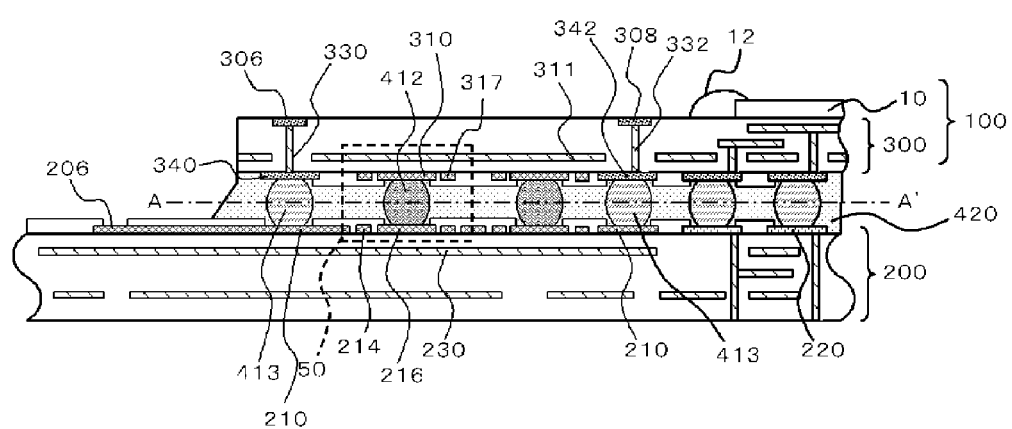
FIG. 24 is a cross-sectional view illustrating a configuration of an electronic device according to a twentieth embodiment.
Figure 25:
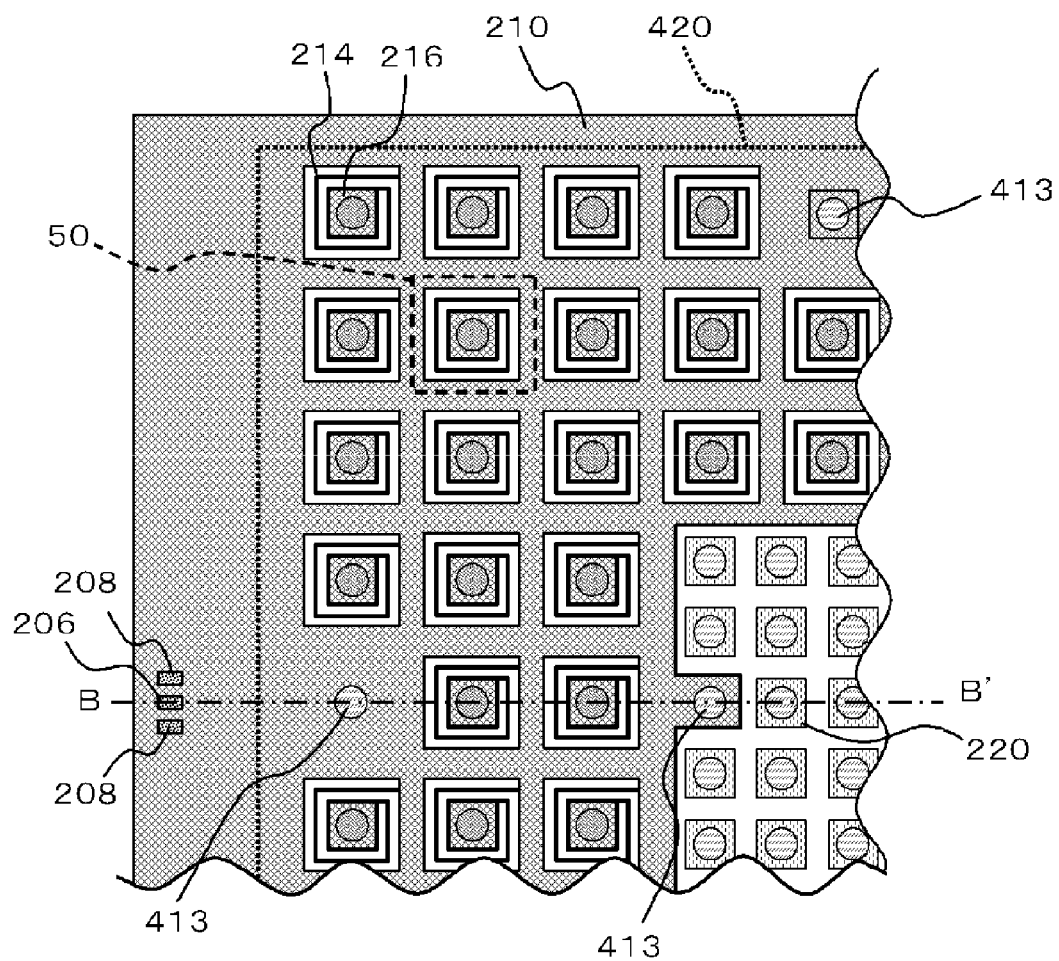
FIG. 25 is a diagram seen downward from the A-A' cross-section of FIG. 24.

FIG. 24 is a cross-sectional view illustrating a configuration of an electronic device according to a twentieth embodiment. FIG. 25 is a diagram seen downward from the A-A' cross-section of FIG. 24, and shows a configuration of the surface of the motherboard 200. FIG. 24 shows the B-B' cross-section of FIG. 25. The electronic device according to the embodiment has the same configuration as the electronic device according to the nineteenth embodiment, except for the following points.

First test terminals 306 and 308 are provided in the package interconnect substrate 300, and second test terminals 206 and 208 are provided in the motherboard 200. The first test terminals 306 and 308 and the second test terminals 206 and 208 are all terminals for testing the EBG structure.

Specifically, the first test terminals 306 and 308 are provided in the surface of the package interconnect substrate 300 not facing the motherboard 200. The first test terminal 306 is connected to a test connection terminal 340 through a via 330. The first test terminal 308 is connected to a test connection terminal 342 through a via 332. The test connection terminals 340 and 342 are all connected to the second conductor pattern 210 through solders 413. The EBG solder 412 is located between the solders 413. That is, the way of disposing the first test terminals 306 and 308 makes the EBG structure located between them. A test terminal connected to other conductors constituting the EBG structure is disposed on both sides of the first test terminals 306 and 308 through a via which is not shown.

The second test terminal 206 is provided in the surface of the motherboard 200 opposite the package interconnect substrate 300, but is disposed so as not to overlap the package interconnect substrate 300. The second test terminal 206 is connected to the second conductor pattern 210, that is, the conductor constituting the EBG structure. The second test terminal 208 is connected to other conductors constituting the EBG structure through a via which is not shown.

Meanwhile, the arrangement and the number of first test terminals 306 and 308, and the arrangement and the number of second test terminals 206 and 208 are not limited to the above-mentioned example. At least one of the first test terminals 306 and 308 and the second test terminals 206 and 208 may be provided with a connection connector.

According to the embodiment, the same effect as that of the nineteenth embodiment is obtained. In addition, the provided first connection terminals 306 and 308 and the second connection terminals 206 and 208 make it possible to test the EBG structure after the package interconnect substrate 300 is mounted onto the motherboard 200. In addition, if the second interconnect 214 takes the configuration of FIG. 22(c) or 22(d), or the third interconnect 317 takes the configuration of FIG. 23(b) or 23(c), the EBG structure can be adjusted after test on the EBG structure.

Figure 26:
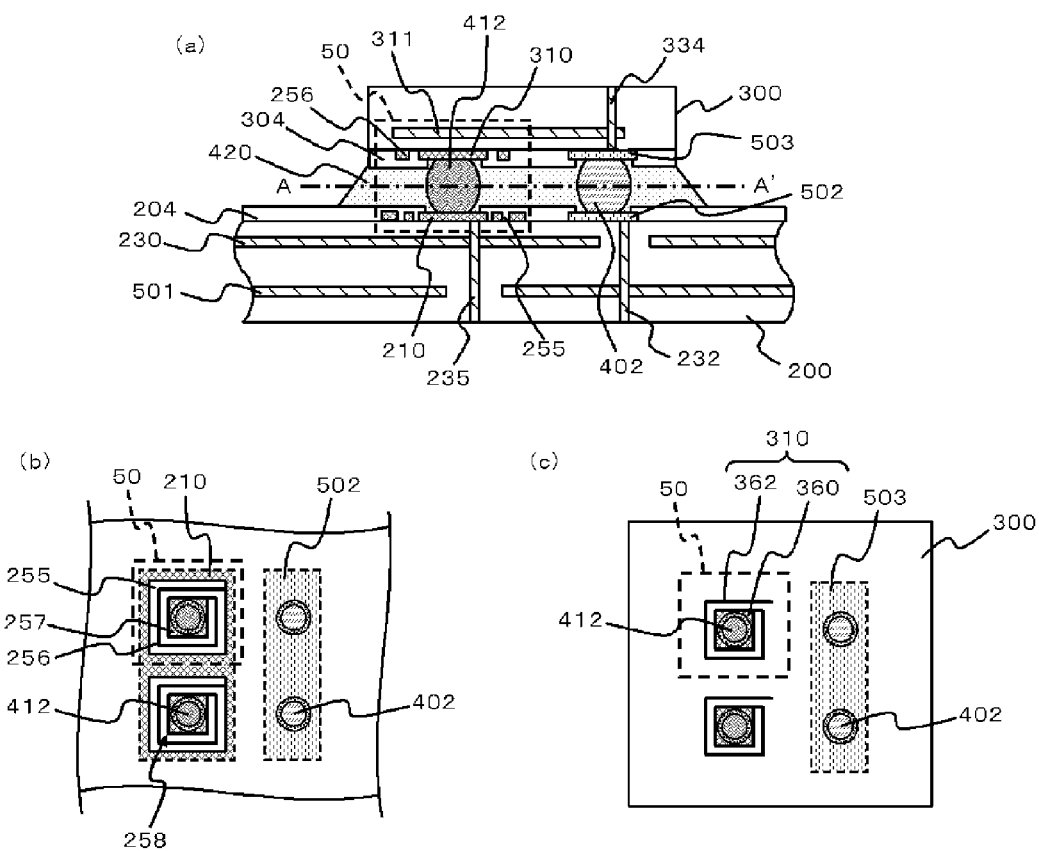
FIG. 26 is a diagram illustrating main parts of a configuration of an electronic device according to a twenty first embodiment.

FIG. 26(a) is a cross-sectional view illustrating main parts of a configuration of an electronic device according to a twenty first embodiment. FIG. 26(b) is a diagram seen downward from the A-A' cross-section of FIG. 26(a), and shows a configuration of the surface of the motherboard 200. FIG. 26(c) is a diagram seen upward from the A-A' cross-section of FIG. 26(a), and shows a configuration of the surface of the package interconnect substrate 300. This electronic device has the same configuration as the electronic device according to the first embodiment, except for the following points.

First, the second conductor pattern 210 formed in the motherboard 200 is formed in a sheet-like conductor pattern as shown in FIG. 26(b). In addition, the first conductor pattern 310 formed in the package interconnect substrate 300 is formed in a plurality of insular conductor patterns as shown in FIG. 26(c). A semiconductor chip is not mounted to the package interconnect substrate 300. The package interconnect substrate 300 includes the conductor pattern 311 one layer below the first conductor pattern 310. The conductor pattern 311 is connected to a conductor pattern 501 of the motherboard 200 through a via 334 and an external connection layer 503 within the package interconnect substrate 300, the solder 402, and an external connection layer 502 and the via 232 of the motherboard 200. The conductor pattern 501 is the power plane or the ground plane, for example, the ground plane, or is connected thereto. The external connection layer 502 and the external connection layer 503 are sheet-like patterns as shown in FIGS. 26(b) and 26(c). A plurality of, for example, two solders 402 are formed on these layers. The first conductor pattern 310 is electrically isolated from other conductors of the package interconnect substrate 300. A plurality of first conductor patterns 310 are electrically conducted to each other through a plurality of EBG solders 412 and second conductor patterns 210.

In the embodiment, the second conductor pattern 210 is connected to the conductor pattern 230 located at the internal interconnect layer of the motherboard 200 through a via 235 formed in the motherboard 200. The conductor pattern 230 is either the power plane or the ground plane of the same type to which the above-mentioned conductor pattern 311 is not connected, for example, the power plane. Nevertheless, the conductor pattern 230 may be either the power plane or the ground plane of the same type to which the conductor pattern 311 is connected. The first insular conductor pattern 310 is not connected to any conductor but the EBG solder 412.

In the second conductor pattern 210, an opening 255 is provided in a region opposite each of the EBG solders 412. An insular conductor 257 and a line portion 256 are provided within the opening 255. The conductor 257 is connected to the EBG solder 412. The line portion 256 connects the conductor 257 to the main body of the second conductor pattern 210. In the example shown in the drawings, the line portion 256 extends in a spiral shape so as to surround the conductor 257. The first conductor pattern 310 includes an insular conductor 360 and a line portion 362. The conductor 360 is connected to the EBG solder 412. The line portion 362 extends in a spiral shape so as to surround the conductor 360.

In the embodiment, the unit cell 50 of the EBG structure 20 is constituted by the conductor pattern 311, the first conductor pattern 310, the EBG solder 912, and the region in the second conductor pattern 210 (including the conductor 257 and the line portion 256) opposite the first conductor pattern 310. Specifically, the second conductor pattern 210 is equivalent to the conductor plane on the lower side. Also, the conductor pattern 311 is equivalent to the conductor plane on the upper side. The EBG solder 412, the conductor 257, and the line portion 256 are equivalent to the mushroom-shaped inductance portion. The first conductor pattern 310 is equivalent to the mushroom-shaped head portion.

In the embodiment, the same effect as that of the first embodiment can also be obtained. In addition, since a semiconductor chip is not mounted to the package interconnect substrate 300, the single package interconnect substrate 300 can be handled as a discrete part for noise suppression. For this reason, in order to suppress noise generated from the motherboard 200, the package interconnect substrate 300 can be mounted to a desired place on the motherboard 200. Also, a plurality of package interconnect substrates 300 can be mounted onto the motherboard 200 side by side.

The first conductor pattern 310 includes the line portion 362 so as to surround the conductor 360. The second conductor pattern 210 includes the path-like line portion 256 so as to surround the conductor 257. Thus, the inductor component of the unit cell 50 constituting the EBG and the control range of the capacitance component can be expanded. The second conductor pattern 210 includes the opening 255, and thus the heat capacity of the portion constituting the unit cell 50 in the second conductor pattern 210 can decrease. In this case, since the conductor 257 is easily warmed up, solder is easily attached when the package interconnect substrate 300 is mounted onto the motherboard 200.

Meanwhile, in the embodiment, the number of connection terminals between the package interconnect substrate 300 and the motherboard 200 shows the total of four of two EBG solders 412 in a matrix and two for other than that, but the number of connection locations of the EBG solder and other than that may be a pair without being limited thereto. More matrices may be formed, and its composition can be made in an arbitrary array. In addition, the EBG structure to be formed shows a case where the line portion or the slit portion is included in the mushroom structure, but an arbitrary EBG structure may be applied without being limited thereto.

Figure 27:
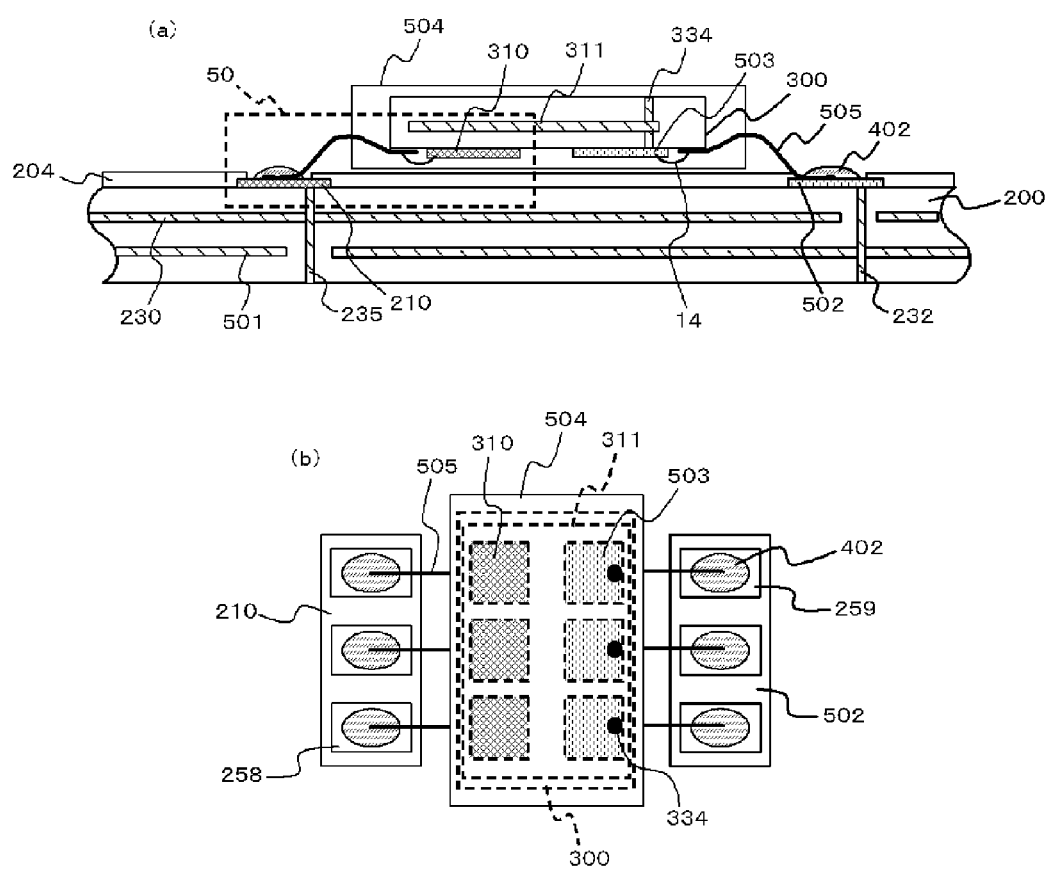
FIG. 27 is a diagram illustrating main parts of a configuration of an electronic device according to a twenty second embodiment.

FIG. 27(a) is a cross-sectional view illustrating main parts of a configuration of an electronic device according to the twenty second embodiment. This electronic device has the same configuration as the electronic device according to the twenty first embodiment, except for the following points.

First, the unit cell 50 of the EBG does not include the line portion or the slit portion. The unit cell includes a lead 505 for connecting the first conductor pattern 310 to the second conductor pattern 210. The first conductor pattern 310 and the lead 505 are connected to each other through a bonding wire 14. The connection between the lead 505 and the second conductor pattern 210 is performed using the solder 402. That is, the first conductor pattern 310 and the second conductor pattern 210 are connected to each other through the lead 505 and the bonding wire 14. The surroundings of the package interconnect substrate 300 are covered with a molding resin 504, and only the terminal portion of the lead 505 is exposed from the molding resin 504. The molding resin 504 also plays a role for protecting the connection location of the bonding wire 14. In the embodiment, the lead 505 is equivalent to the inductance portion of the unit cell 50 of the EBG. The inductance component within the unit cell 50 can be adjusted by a change in the lead shape.

FIG. 27(b) is a top view of the electronic device shown in FIG. 27(a). The package interconnect substrate 300 includes three leads 505, disposed at equal pitches, on the left side. All of these three leads 505 constitute the EBG. The package interconnect substrate also includes three leads 505, disposed at equal pitches, on the right side. In an opening 258 formed in the resist layer 204 of the motherboard 200, the leads 505 on the left side are connected to the second conductor pattern 210 through the solders 402. In an opening 259 formed in the resist layer 204 of the motherboard 200, the leads 505 on the right side are connected to the external connection layer 502 through the solders 402. The external connection layer 503 of the package interconnect substrate 300 is insular, and is connected to the conductor pattern 311 through the via 334.

Meanwhile, in the embodiment, the number of connection portions of the package interconnect substrate 300 and the motherboard 200 shows the total of six of three columns for the EBG in a matrix on the left side and three columns for other than that on the right side, but is not limited thereto. For example, the leads 505 on the EBG side and the leads 505 other than that may be a pair, and more terminals may also be arranged in the depth direction of FIG. 27(a). It is also acceptable to arbitrarily arrange the leads 505 on the EBG side functioning as terminals constituting the EBG and the leads 505 functioning as terminals other than those. A case is shown in which the connection between the first conductor pattern 310 and the lead 505 is performed by the bonding wire 14, but the embodiment is not limited to this case. Connection means such as solder may be used. In the embodiment, a small outline package (SOP) is shown as a package form of the package interconnect substrate 300, but the embodiment is not limited to this. The shape of the lead and the position taking the lead out of the package interconnect substrate 300 may be arbitrarily selected with respect to the side or surface of the package interconnect substrate 300.

Figure 28:
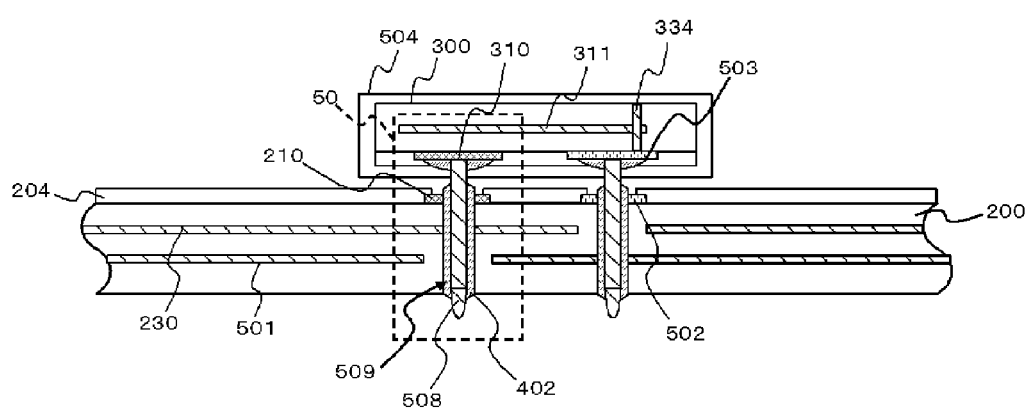
FIG. 28 is a diagram illustrating main parts of a configuration of an electronic device according to a twenty third embodiment.

FIG. 28 is a cross-sectional view illustrating main parts of a configuration of an electronic device according to a twenty third embodiment. This electronic device has the same configuration as the electronic device according to the twenty second embodiment, except for the following points.

The unit cell 50 of the EBG shown in FIG. 28 includes pin contacts 508 connecting the package interconnect substrate 300 to the motherboard 200. Specifically, the pin contacts 508 are provided in each of the first conductor pattern 310 and the external connection layer 503 on the package interconnect substrate 300. Part-mounting through-holes 509 for inserting the pin contact 508 are provided in the motherboard 200. The second conductor pattern 210 and the conductor pattern 230 within the motherboard 200 are connected to each other through the through-hole 509. The external connection layer 502 and the conductor pattern 501 are also connected to each other through another through-hole 509. The pin contacts 508 are inserted into the through-holes 509, and they are connected to each other using the solder 402. Thus, the package interconnect substrate 300 and the motherboard 200 are connected to each other. In the embodiment, the pin contact 508 is equivalent to the inductance portion of the unit cell 50 of the EBG. The inductance component within the unit cell 50 can be adjusted by a change in the shape of the pin contact.

Meanwhile, in the embodiment, the terminals of the connection portion between the package interconnect substrate 300 and the motherboard 200 can also be arbitrarily arranged in the depth direction similarly to the twenty second embodiment. Also, the pin contacts 508 on the EBG side functioning as terminals constituting the EBG and the pin contacts 508 functioning as terminals other than those may also be arranged in arbitrary combination similarly to the twenty second embodiment.

Figure 29:
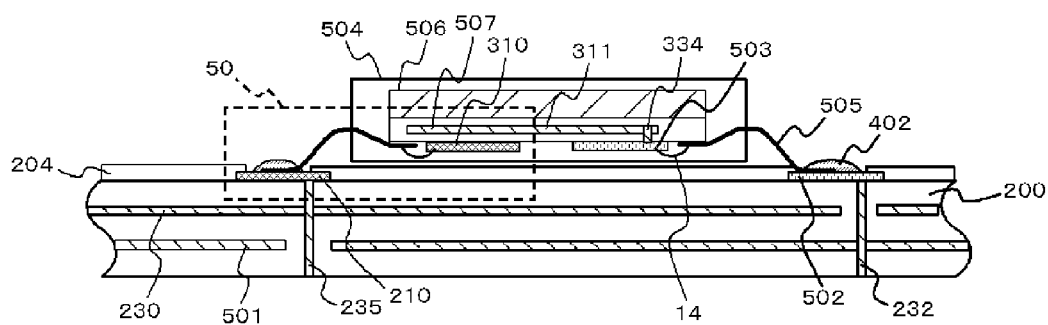
FIG. 29 is a diagram illustrating main parts of a configuration of an electronic device according to a twenty fourth embodiment.

FIG. 29 is a cross-sectional view illustrating main parts of a configuration of an electronic device according to a twenty fourth embodiment. This electronic device has the same configuration as the electronic device according to the twenty second embodiment, except for the following points.

The unit cell 50 of the EBG shown in FIG. 29 includes a thin-film interconnect layer 507. Specifically, in the embodiment, the unit cell includes a silicon substrate 506 and the multilayer thin-film interconnect layer 507 formed on the silicon substrate 506, instead of the package interconnect substrate 300 used in the twenty second embodiment. The thin-film interconnect layer 507 is formed by an insulating film such as polyimide or $SiO_2$ and a metal such as copper or nickel. The use of a thin-film process enables forming a thin insulating layer between the metal layers, and makes it possible to obtain an effect to expand the control range of the capacitance component of the unit cell 50 constituting the EBG.

In the embodiment, the terminals of the connection portion between the package interconnect substrate 300 and the motherboard 200 may also be arbitrarily arranged in the depth direction similarly to the twenty second embodiment. Also, the leads 505 on the EBG side functioning as terminals for constituting the EBG and the leads 505 functioning as terminals other than those may be arranged in arbitrary combination similarly to the twenty second embodiment.

In the above description, the embodiments of the invention have been set forth with reference to the drawings, but they are merely illustrative of the invention. Various configurations other than stated above may be adopted. For example, in each of the embodiments mentioned above, the first conductor pattern 310 is formed on the surface 302 of the package interconnect substrate 300 opposite the motherboard 200, but the first conductor pattern 310 may be formed in the internal interconnect layer of the package interconnect substrate 300. The second conductor pattern 210 is formed on the surface 202 of the motherboard 200 opposite the package interconnect substrate 300, but the second conductor pattern 210 may be formed in the internal interconnect layer of the motherboard 200.

The configuration of the EBG structure 20 is not limited to the above-mentioned embodiments, but an arbitrary structure indicating the EBG characteristics may be applied to the EBG structure 20.

In the above-mentioned embodiments, the semiconductor chip is illustrated as the electronic device mounted onto the package interconnect substrate, but electrical parts other than the semiconductor chip may be used. The structures shown in each of the embodiments mentioned above may be applied to a structure for generating an electrical connection by mechanical press of the package against the board, like a land used for a land grid array. The disposition location of the EBG structure 20 is not limited to the above-mentioned examples.

The application claims priorities from Japanese Patent Application Nos. 2009-257059 filed on Nov. 10, 2009, 2010-055539 filed on Mar. 12, 2010, and 2010-207829 filed on Sep. 16, 2010, the contents of which are incorporated herein by reference in its entirety.

The invention claimed is:

1. An electronic device comprising:
   a first interconnect substrate including a first conductor;
   a second interconnect substrate connected to the first interconnect substrate, including a second conductor of which at least a portion is formed in a region opposite the first conductor, the second conductor forming a repeated structure of conductors, and the second conductor being electrically isolated from other conductors included in the second interconnect substrate;
   a socket including a connection portion that is formed on the first conductor of the first interconnect substrate, and includes an insertion portion; and
   a connecting member that is formed on the second conductor of the second interconnect substrate, and inserted into the insertion portion,
   wherein the first conductor comprises a portion of an electromagnetic band gap (EBG) structure and the second conductor comprises a portion of the EBG structure, and
   wherein the second interconnect substrate comprises a package interconnect substrate.

2. The electronic device according to claim 1, further comprising:
   a first external connection terminal formed over a surface of the first interconnect substrate, the surface being opposite the second interconnect substrate; and
   a second external connection terminal formed over a surface of the second interconnect substrate, the surface being opposite the first interconnect substrate,
   wherein the connecting member connects connecting the first external connection terminal to the second external connection terminal, and
   wherein the first conductor and the second conductor are formed to surround the first external connection terminal, the second external connection terminal, and the connecting member in a plan view.

3. The electronic device according to claim 1, wherein the first conductor is formed over a surface of the first interconnect substrate, the surface being opposite the second interconnect substrate.

4. The electronic device according to claim 1, wherein the second conductor is formed over a surface of the second interconnect substrate, the surface being opposite the first interconnect substrate.

5. The electronic device according to claim 1, further comprising:
   a first test terminal provided in the first interconnect substrate and functioning as a terminal for testing the EBG structure; and
   a second test terminal provided in the second interconnect substrate and functioning as a terminal for testing the EBG structure in collaboration with the first test terminal.

6. The electronic device according to claim 1, further comprising electronic parts mounted over the first interconnect substrate or the second interconnect substrate.

7. The electronic device according to claim 1, wherein the first conductor comprises a sheet-like conductor, and the second conductor forms a plurality of insular conductors separated from each other, and
   wherein the connecting member comprises:
   a plurality of auxiliary connecting members provided to the plurality of insular conductors and connecting the insular conductors to the sheet-like conductor.

8. The electronic device according to claim 7, further comprising:
   a sheet-like conductor provided in the second interconnect substrate, the interconnect substrate including the plurality of insular conductors, the sheet-like conductor being located in a layer below the plurality of insular conductors in the interconnect substrate, at least a portion of the sheet-like conductor being opposite the plurality of insular conductors.

9. The electronic device according to claim 7, wherein at least one auxiliary connecting member of said plurality of auxiliary connecting members comprises a pin.

10. The electronic device according to claim 9, wherein the pin includes a portion extending in a spiral shape or a portion extending in a meandering shape.

11. An electronic device comprising:
    a first interconnect substrate; and
    a second interconnect substrate connected to the first interconnect substrate,
    wherein the first interconnect substrate includes a first conductor, the second interconnect substrate includes a second conductor of which at least a portion is formed in a region opposite the first conductor, the second conductor forms a repeated structure of conductors, and the second conductor is electrically isolated from other conductors included in the second interconnect substrate,
    wherein the first conductor comprises a portion of an electromagnetic band gap (EBG) structure and the second conductor comprises a portion of the EBG structure,
    wherein one element selected from a group consisting of the first conductor and the second conductor comprises a sheet-like conductor,
    wherein another element selected from the group consisting of the first conductor and the second conductor forms a plurality of insular conductors separated from each other,
    wherein the electronic device further comprises:
    a plurality of auxiliary connecting members provided to the plurality of insular conductors and connecting the insular conductors to the sheet-like conductor,
    wherein at least one auxiliary connecting member of said plurality of auxiliary connecting members includes:
    a plurality of pins connected to one element selected from a group consisting of the sheet-like conductor and the plurality of insular conductors, the plurality of pins corresponding to the plurality of insular conductors; and
    a socket connected to another element selected from the group consisting of the sheet-like conductor and the plurality of insular conductors, and
    wherein the plurality of pins are inserted into the socket.

12. The electronic device according to claim 11, wherein the socket includes:
    an insertion portion provided to the plurality of pins, each of the pins being inserted into the insertion portion; and
    an interconnect connecting the pins inserted into the insertion portion to the other element selected from the group consisting of the sheet-like conductor and the plurality of insular conductors, and
    wherein the interconnect includes a portion extending in a spiral shape or a portion extending in a meandering shape.

13. The electronic device according to claim 11, wherein the socket includes:
    an insertion portion provided to the plurality of pins, each of the pins being inserted into the insertion portion;
    a capacitor element configuration member opposite the other element selected from the group consisting of the sheet-like conductor and the plurality of insular conductors, the capacitor element configuration member comprising a capacitor element of which one electrode is served by the other element; and an interconnect connecting the capacitor element configuration member to the pins inserted into the insertion portion.

14. The electronic device according to claim 13, wherein the capacitor element configuration member is fixed to the other element selected from the group consisting of the sheet-like conductor and the plurality of insular conductors.

15. The electronic device according to claim 7, wherein the sheet-like conductor includes:

an opening located at the periphery of at least one auxiliary connecting member of said plurality of auxiliary connecting members;

a connection conductor provided in the opening and connected to the auxiliary connecting member; and a second interconnect provided in the opening and connecting the connection conductor to the sheet-like conductor.

16. The electronic device according to claim 15, further comprising a plurality of the second interconnects, wherein at least one of the second interconnects is disconnected, and at least another of the second interconnects is not disconnected.

17. The electronic device according to claim 7, further comprising a third interconnect of which one end is connected to the insular conductor and another end comprises an open end.

18. The electronic device according to claim 17, wherein the third interconnect is disconnected halfway.

19. The electronic device according to claim 2, wherein the connecting member comprises a solder.

20. A noise suppression method comprising:

providing a first conductor in a first interconnect substrate over which electrical parts are to be mounted;

providing a second conductor in at least a portion of a region in a second interconnect substrate, the region being opposite the first conductor, wherein the first interconnect substrate and the electrical parts are to be mounted over the second interconnect substrate;

forming a repeated structure of at least either the first conductor or the second conductor, and forming at least a portion of an electromagnetic band gap (EBG) structure by the first conductor and the second conductor, the method preventing a noise from propagating through a space between the first interconnect substrate and the second interconnect substrate;

providing a socket including a connection portion that is formed on the first conductor of the first interconnect substrate, and includes an insertion portion; and providing a connecting member that is formed on the second conductor of the second interconnect substrate, and inserted into the insertion portion, wherein the second interconnect substrate comprises a package interconnect substrate.

21. An electronic device comprising:

a first interconnect substrate including a first conductor;

a second interconnect substrate connected to the first interconnect substrate and comprising a plurality of conductors including a second conductor which is formed opposite the first conductor and is electrically isolated from other conductors in the plurality of conductors; and an electromagnetic band gap (EBG) structure formed in a space between the first and second interconnect substrates, and comprising:

the first and second conductors;

a socket including a connection portion that is formed on the first conductor of the first interconnect substrate, and includes an insertion portion; and a connecting member that is formed on the second conductor of the second interconnect substrate, and inserted into the insertion portion, wherein the second interconnect substrate comprises a package interconnect substrate.

* * * * *